(12) United States Patent
Chen et al.

(10) Patent No.: US 11,134,776 B2
(45) Date of Patent: Oct. 5, 2021

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/806,032

(22) Filed: Mar. 2, 2020

(65) Prior Publication Data

US 2021/0145174 A1    May 20, 2021

(30) Foreign Application Priority Data

Nov. 18, 2019    (TW) .................................. 108142051

(51) Int. Cl.
*A47B 88/443*    (2017.01)
*A47B 88/49*    (2017.01)
*A47B 88/497*    (2017.01)

(52) U.S. Cl.
CPC ............ *A47B 88/443* (2017.01); *A47B 88/49* (2017.01); *A47B 88/497* (2017.01); *A47B 2210/007* (2013.01)

(58) Field of Classification Search
CPC ...... A47B 88/49; A47B 88/443; A47B 88/497

USPC .............................. 312/334.8, 334.44, 319.1
See application file for complete search history.

(56) References Cited

U.S. PATENT DOCUMENTS

| 6,749,276 | B2 | 6/2004 | Judge et al. | |
|---|---|---|---|---|
| 7,677,679 | B2 * | 3/2010 | Hsiung .................. | A47B 88/49 312/333 |
| 9,629,459 | B2 | 4/2017 | Chen et al. | |
| 9,681,749 | B2 | 6/2017 | Chen et al. | |
| 9,992,906 | B2 | 6/2018 | Chen et al. | |
| 10,041,535 | B2 | 8/2018 | Chen et al. | |
| 10,244,868 | B2 | 4/2019 | Chen et al. | |
| 2005/0116594 | A1 | 6/2005 | Barry, Jr. et al. | |
| 2009/0001864 | A1 * | 1/2009 | Huang .................... | A47B 88/49 312/333 |
| 2013/0077900 | A1 * | 3/2013 | Lowe ...................... | A47B 88/49 384/18 |
| 2018/0202490 | A1 | 7/2018 | Chen et al. | |
| 2019/0313794 | A1 | 10/2019 | Tang | |

* cited by examiner

*Primary Examiner* — James O Hansen
(74) *Attorney, Agent, or Firm* — Karin L. Williams; Alan D. Kamrath; Mayer & Williams PC

(57) ABSTRACT

A slide rail assembly includes a first rail, a second rail, a third rail and a switch member. The second rail is movably mounted between the first rail and the third rail. The switch member is linearly movable and configured to be switched between a first state and a second state. When the switch member is in the second state, the second rail is configured to be driven by the third rail to move to a predetermined position along a retracting direction. When the third rail is moved relative to the second rail at the predetermined position along an extending direction, the switch member is configured to be switched from the second state to the first state.

15 Claims, 19 Drawing Sheets

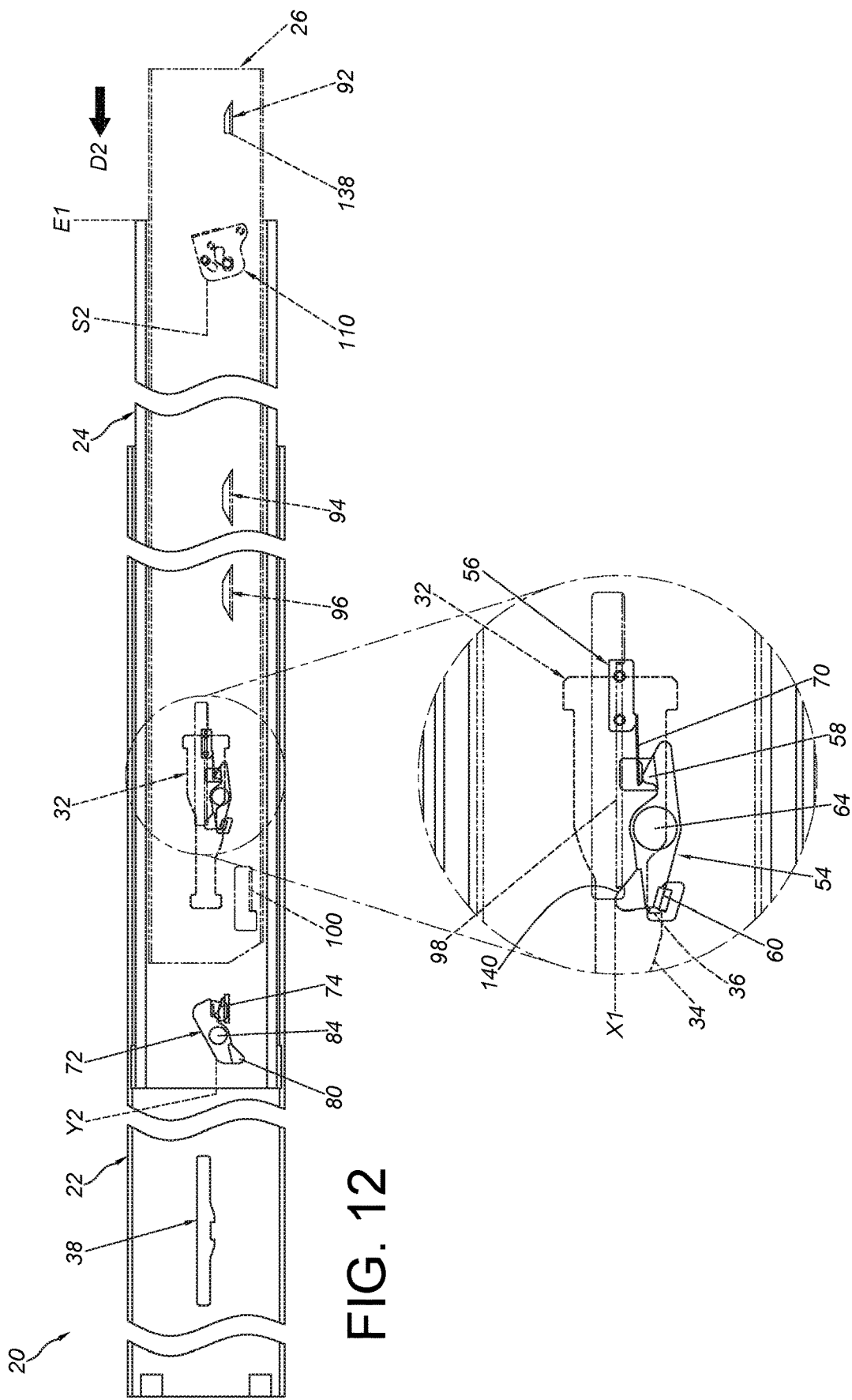

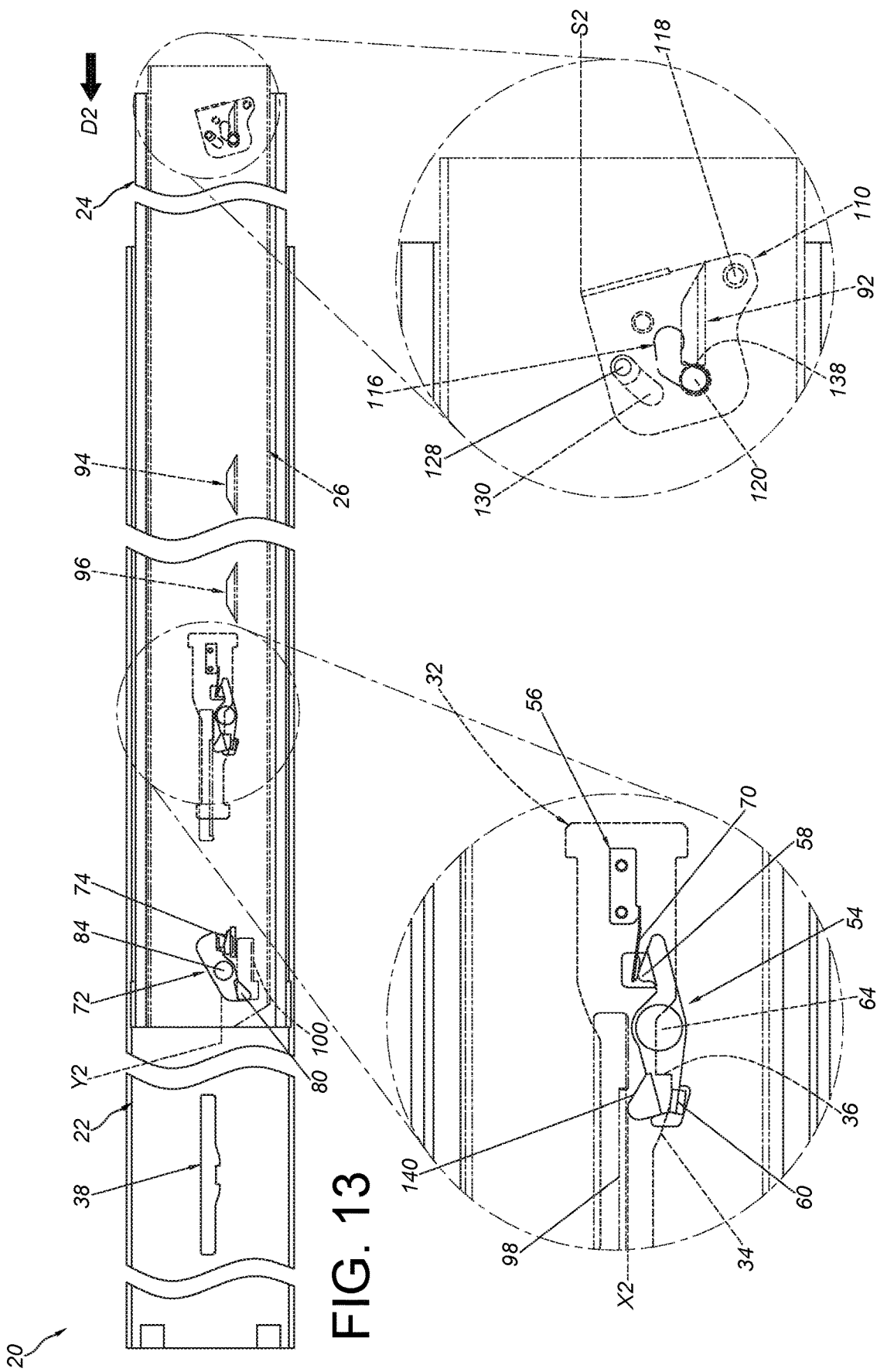

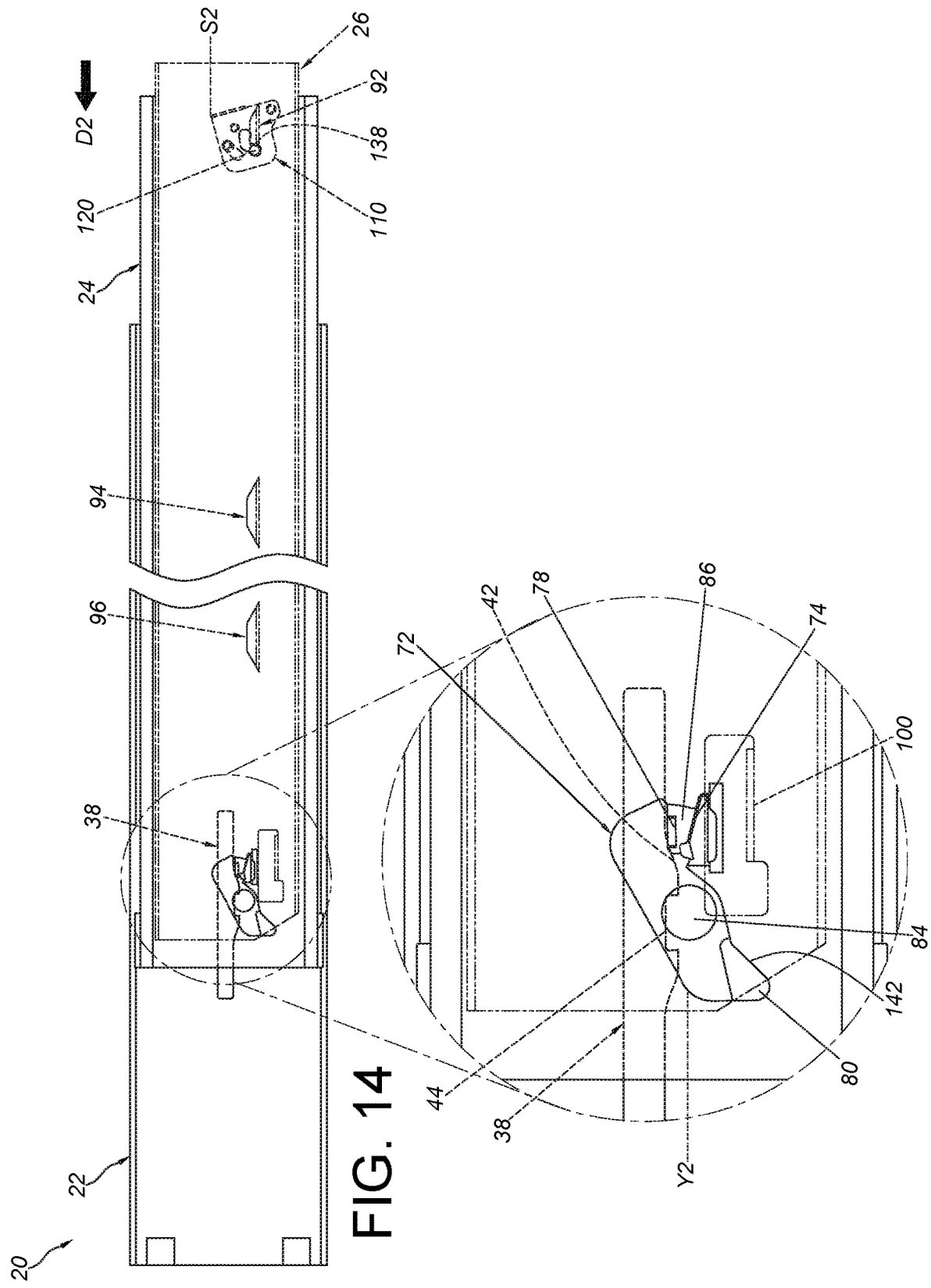

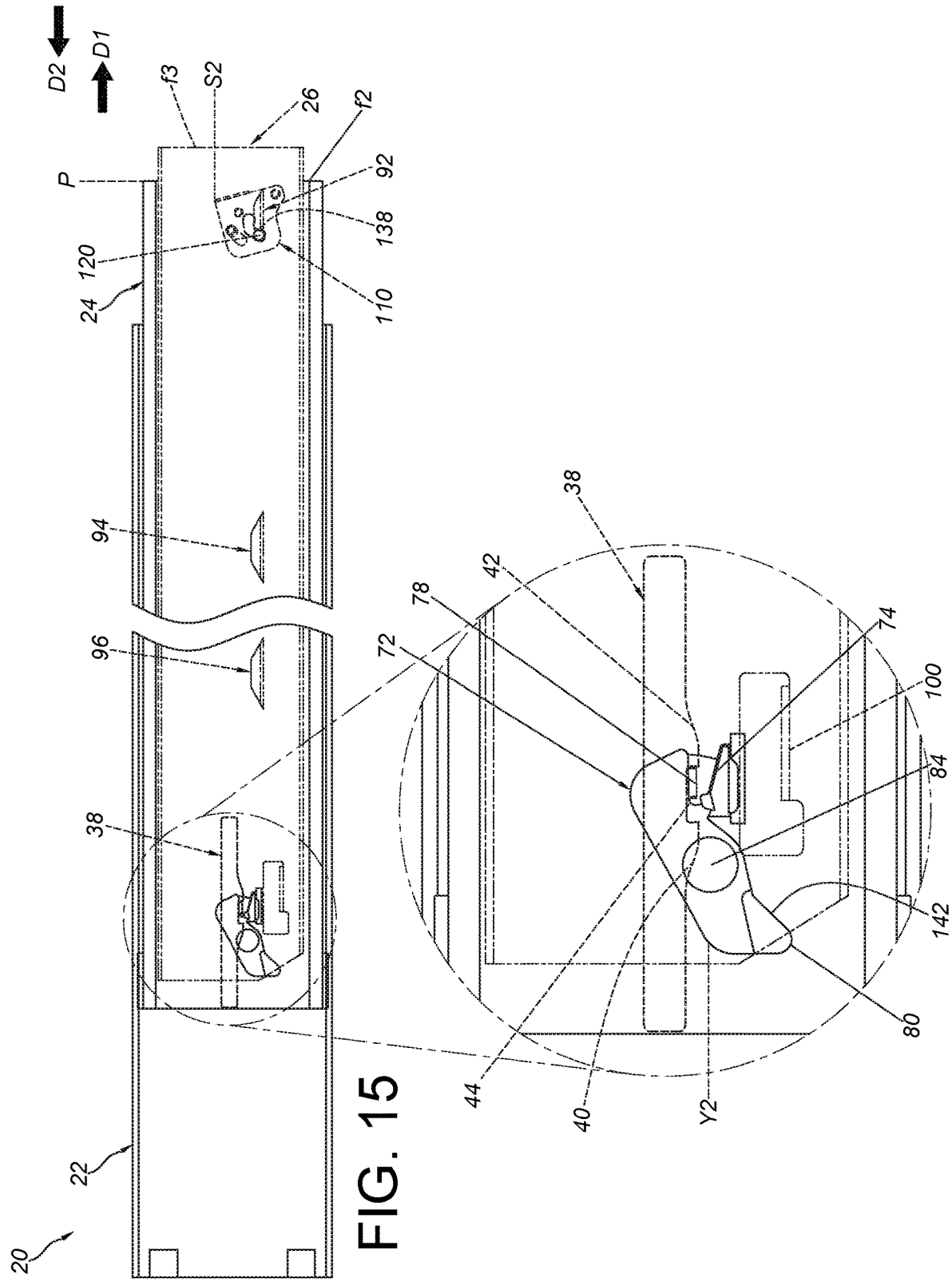

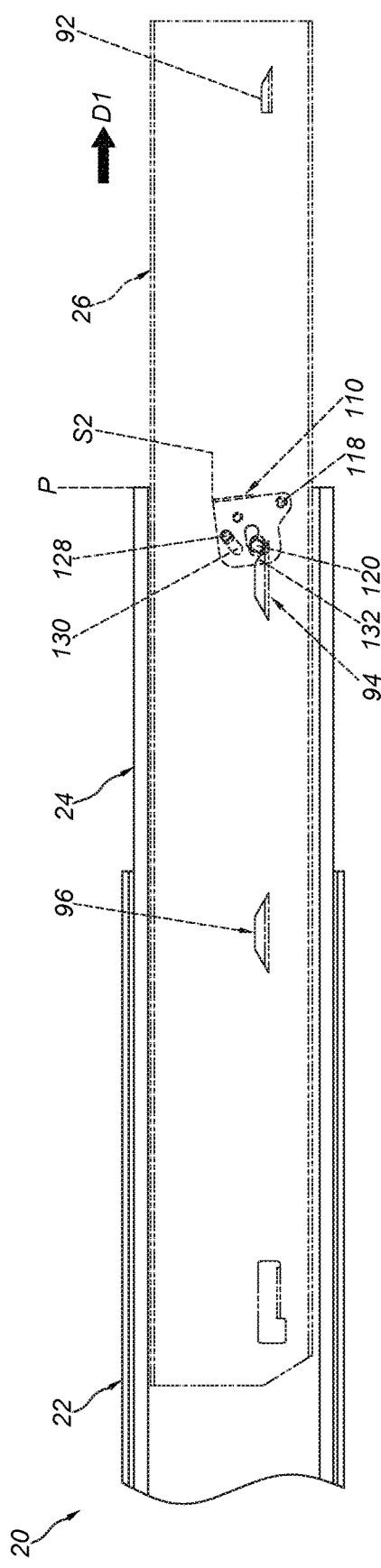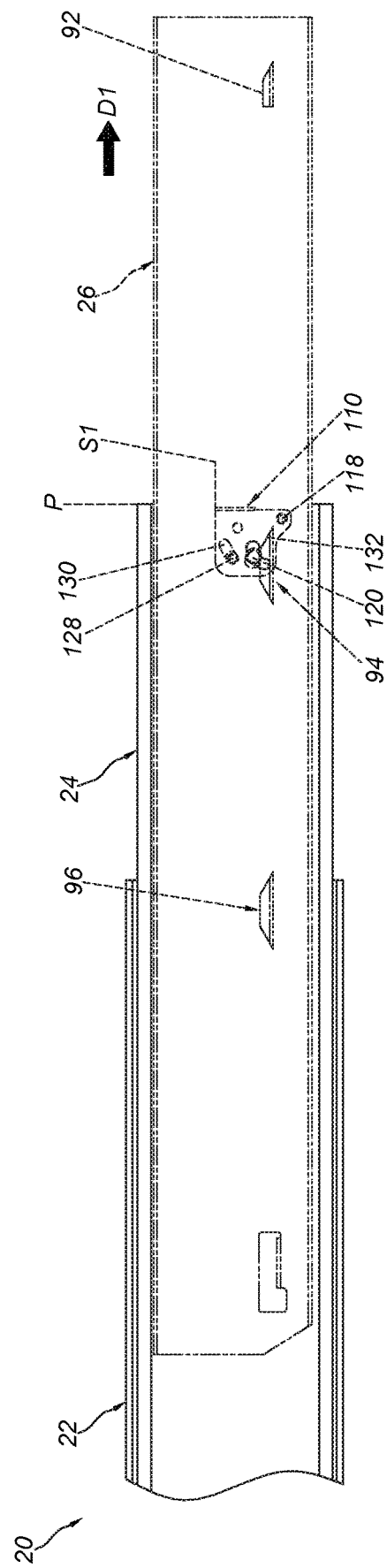

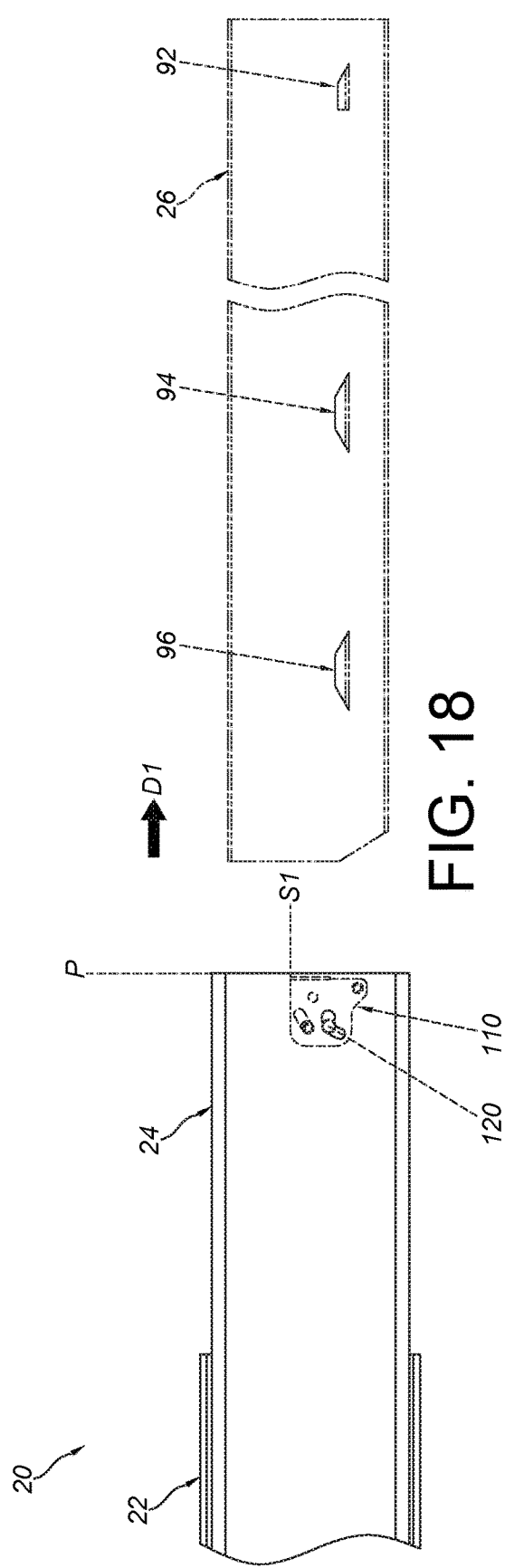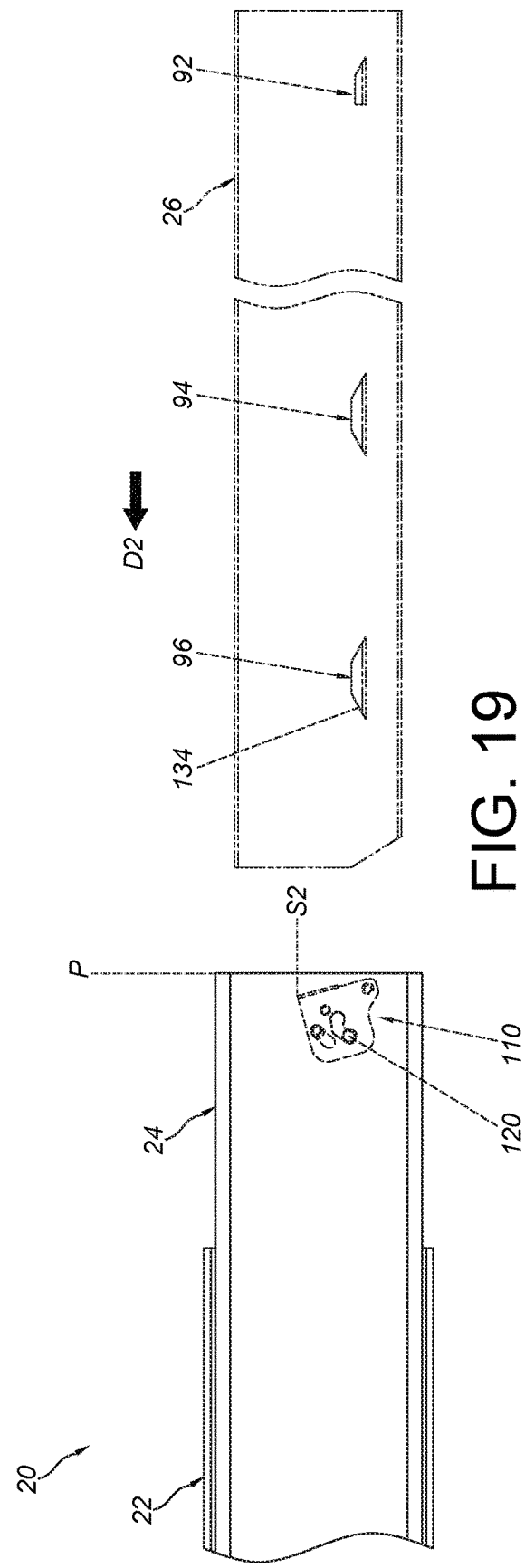

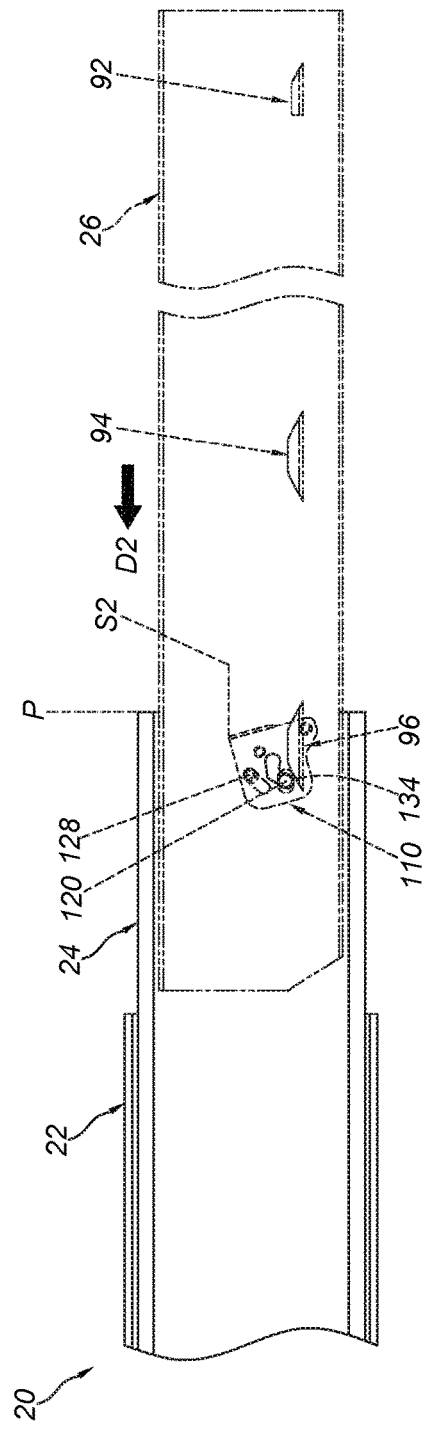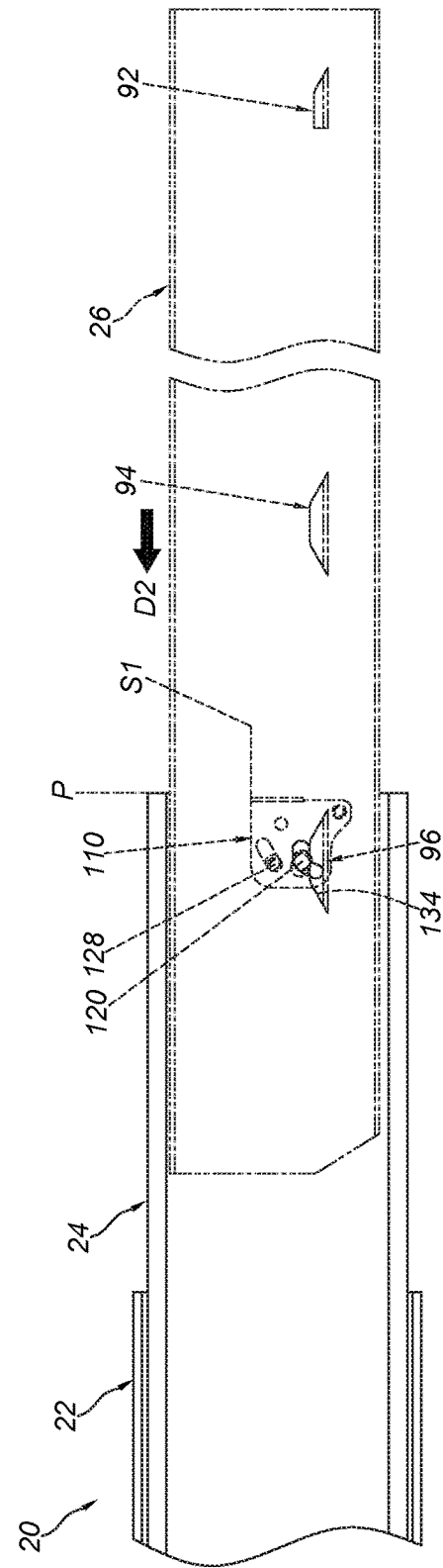

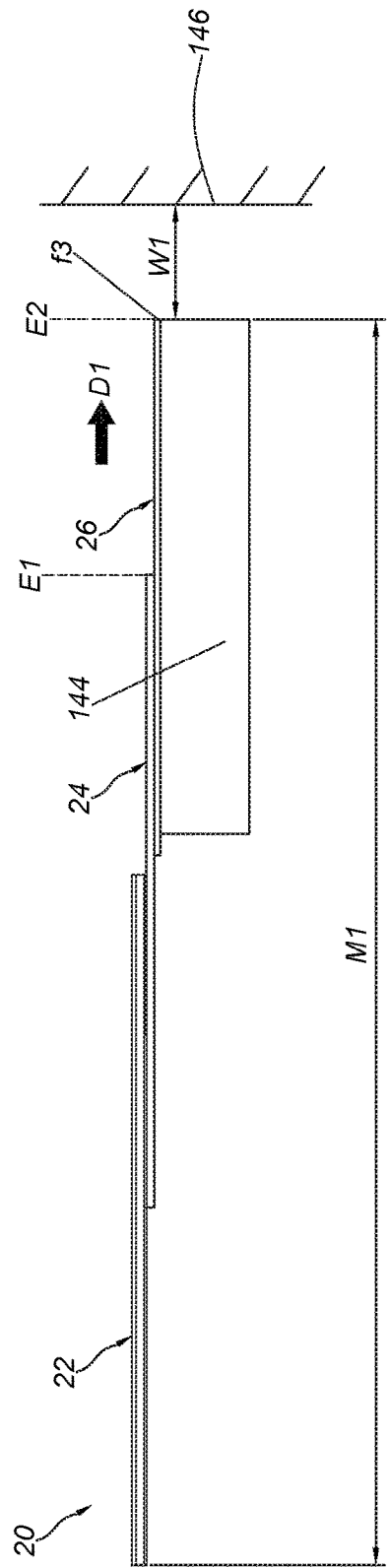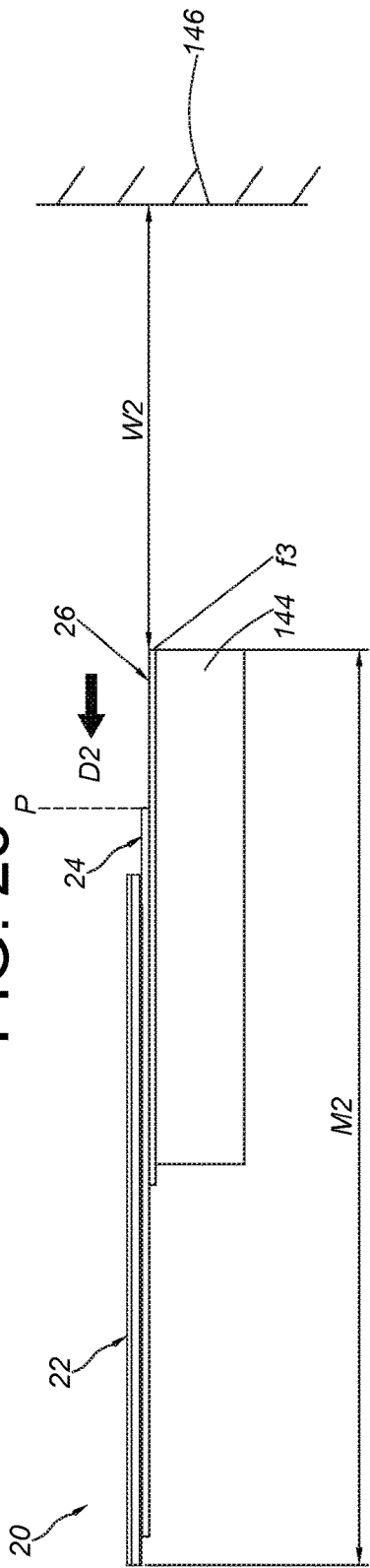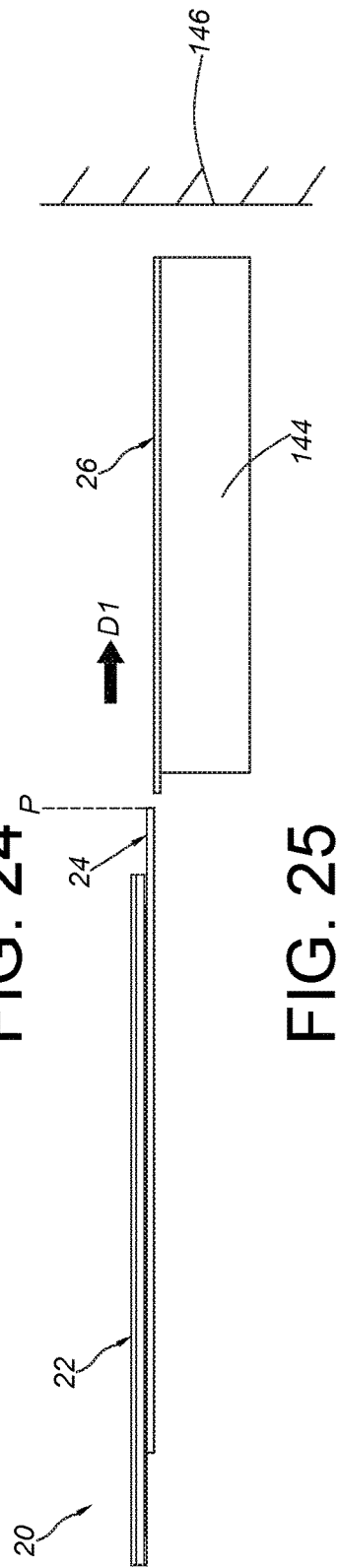

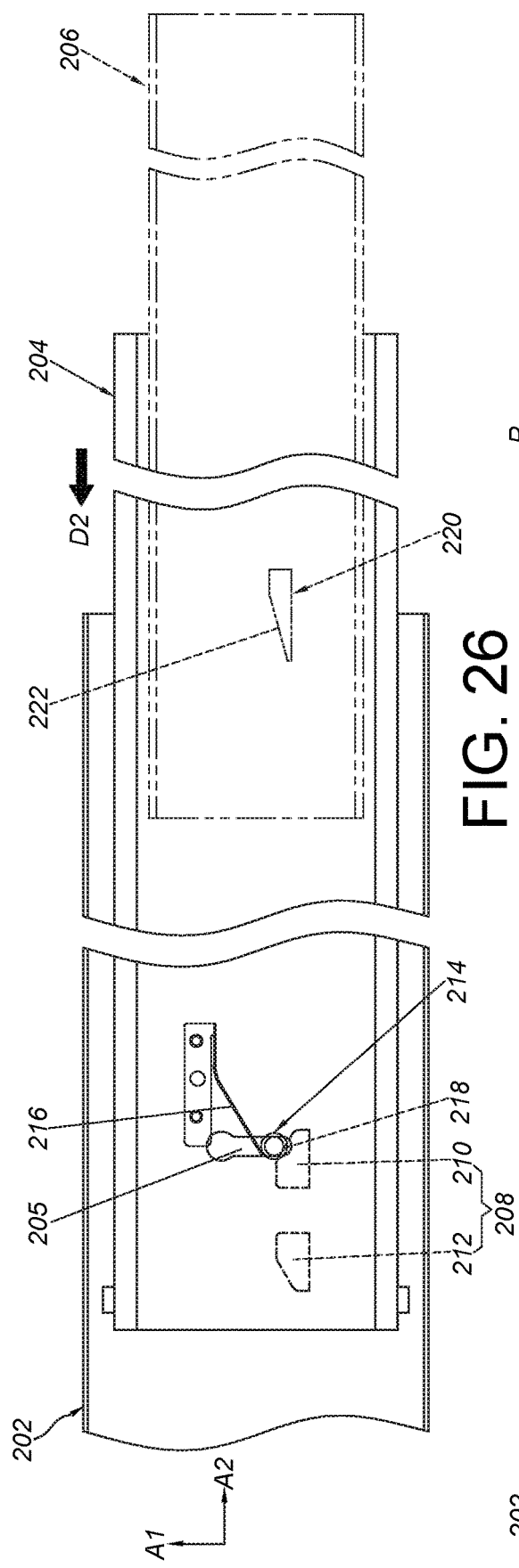
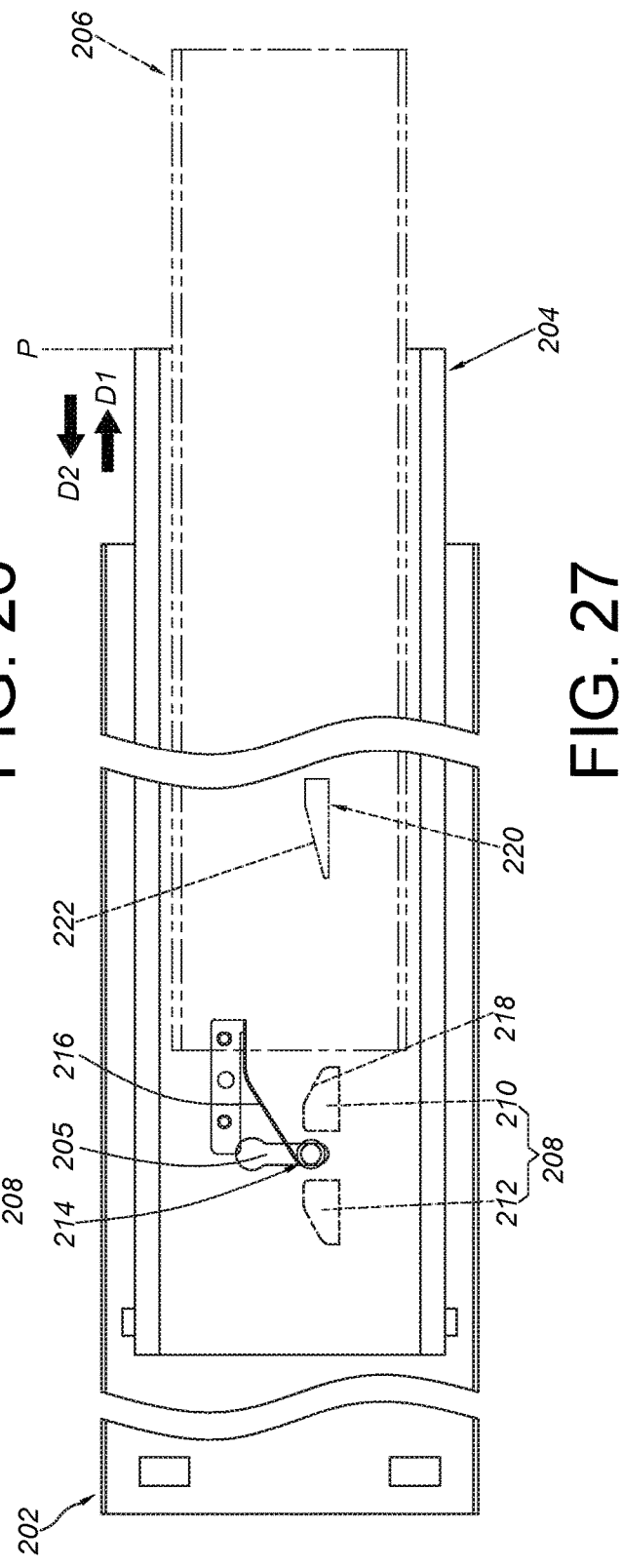

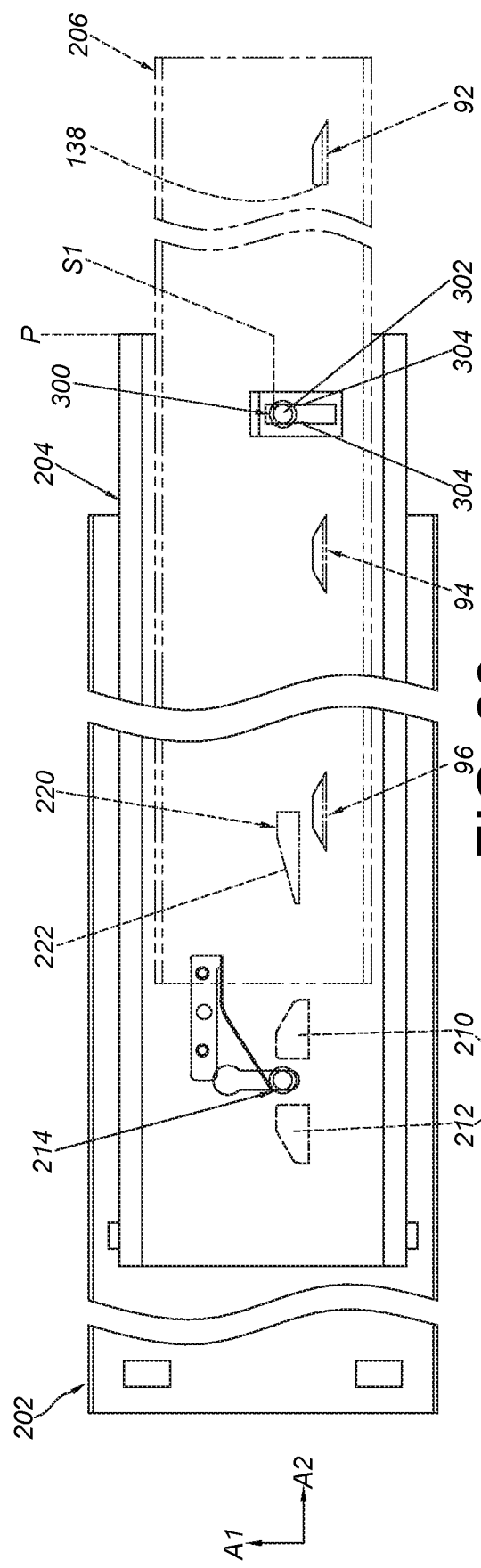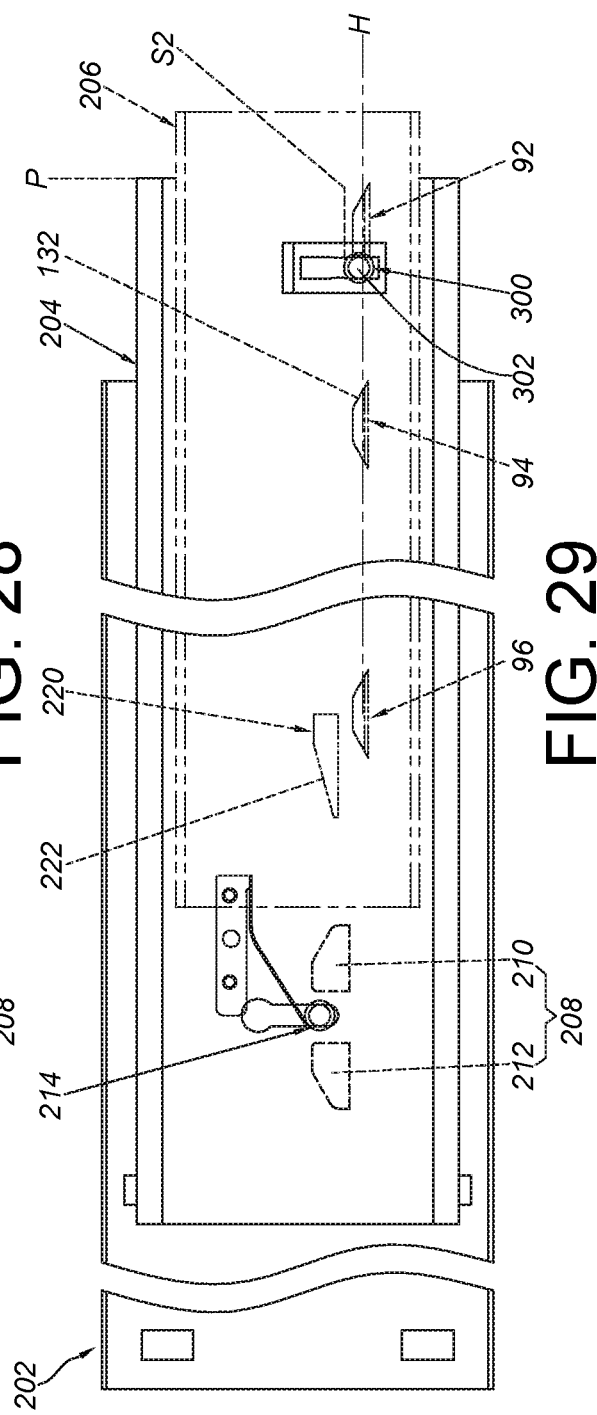

US 11,134,776 B2

SLIDE RAIL ASSEMBLY

BACKGROUND OF THE INVENTION

1. Field of the Invention

The present invention relates to a slide rail assembly, and more particularly, to a slide rail assembly with adjustable extension length in order to facilitate maintenance operation of the slide rail assembly in a limited space.

2. Description of the Prior Art

U.S. Pat. No. 10,244,868 B2 discloses a slide rail assembly comprising a first rail, a second rail and a third rail. The third rail is arranged with a switching member configured to be operated to be at a first switch position or a second switch position. When the switching member is located at the second switch position, the third rail is configured to drive the second rail to move along a second direction (retracting direction), such that a total length of the slide rail assembly is reduced to facilitate utilization of the slide rail assembly in a narrow space. The switching member is arranged on the third rail, and a user can only operate the switching member manually. If the switching member is not switched back to the first switch position properly by the user, the rails can not be fully retracted.

For such issue and different market requirements, it is important to develop various slide rail products.

SUMMARY OF THE INVENTION

The present invention provides a slide rail assembly capable of using a slide rail to drive a switch member to switch from a state to another state.

According to an embodiment of the present invention, a slide rail assembly comprises a first rail, a second rail, a rear base and a rear engaging mechanism. The second rail is movable relative to the first rail. The rear base is arranged on the first rail, the rear base comprising a first base part and a second base part. The rear engaging mechanism is arranged on the second rail. The rear engaging mechanism comprises an engaging member linearly movable relative to the second rail along a linear direction. When the second rail is located at a predetermined position relative to the first rail, the engaging member of the rear engaging mechanism is blocked by the first base part of the rear base, in order to prevent the second rail from being moved from the predetermined position along an extending direction. When the second rail is located at the predetermined position, the engaging member of the rear engaging mechanism is blocked by the second base part of the rear base, in order to prevent the second rail from being moved from the predetermined position along a retracting direction.

According to another embodiment of the present invention, a slide rail assembly, a slide rail assembly comprises a first rail, a second rail, a third rail and a switch member. The second rail is movable relative to the first rail. The third rail is movable relative to the second rail. The switch member is linearly movable relative to the second rail to be in one of a first state and a second state. When the second rail is located at a predetermined position relative to the first rail, the third rail is configured to drive the switch member to switch from the second state to the first state during the third rail being moved a predetermined extended distance relative to the second rail at the predetermined position along an extending direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 12 is a diagram showing the slide rail assembly being moved along a retracting direction according to the first embodiment of the present invention;

FIG. 13 is a diagram showing a third rail of the slide rail assembly being moved along the retracting direction to one position according to the first embodiment of the present invention;

FIG. 14 is a diagram showing the second rail being driven by the third rail to move relative to a first rail along the retracting direction according to the first embodiment of the present invention;

FIG. 15 is a diagram showing the second rail being driven by the third rail to move along the retracting direction to a predetermined position relative to the first rail according to the first embodiment of the present invention;

FIG. 16 is a diagram showing the second rail being located at the predetermined position relative to the first rail with the third rail being moved along the extending direction according to the first embodiment of the present invention;

FIG. 17 is a diagram showing the third rail being moved along the extending direction to drive the switch member to be in the first state according to the first embodiment of the present invention;

FIG. 18 is a diagram showing the switch member being in the first state when the third rail is detached from a passage of the second rail along the extending direction according to the first embodiment of the present invention;

FIG. 19 is a diagram showing the switch member being in the second state when the third rail is detached from the passage of the second rail along the extending direction according to the first embodiment of the present invention;

FIG. 20 is a diagram showing the third rail being mounted to the passage of the second rail along the retracting direction according to the first embodiment of the present invention;

FIG. 21 is a diagram showing the switch member being switched to the first state when the third rail is mounted to the passage of the second rail along the retracting direction according to the first embodiment of the present invention;

FIG. 23 is a diagram showing the slide rail assembly having a first length when the slide rail assembly is configured to carry a carried object and located at the first extended position according to the first embodiment of the present invention;

FIG. 24 is a diagram showing the slide rail assembly having a second length when the second rail of the slide rail assembly is located at the predetermined position according to the first embodiment of the present invention;

FIG. 25 is a diagram showing the second rail of the slide rail assembly being located at the predetermined position with the third rail being detached from the second rail along the extending direction according to the first embodiment of the present invention;

FIG. 26 is a diagram showing a slide rail assembly with a second engaging member being not blocked by a rear base according to a second embodiment of the present invention;

FIG. 27 is a diagram showing the slide rail assembly with the second engaging member being blocked by the rear base according to the second embodiment of the present invention;

FIG. 28 is a diagram showing a slide rail assembly with a switch member being in a first state according to a third embodiment of the present invention; and FIG. 29 is a diagram showing the slide rail assembly with the switch member being in a second state according to the third embodiment of the present invention.

DETAILED DESCRIPTION

Figure 1:
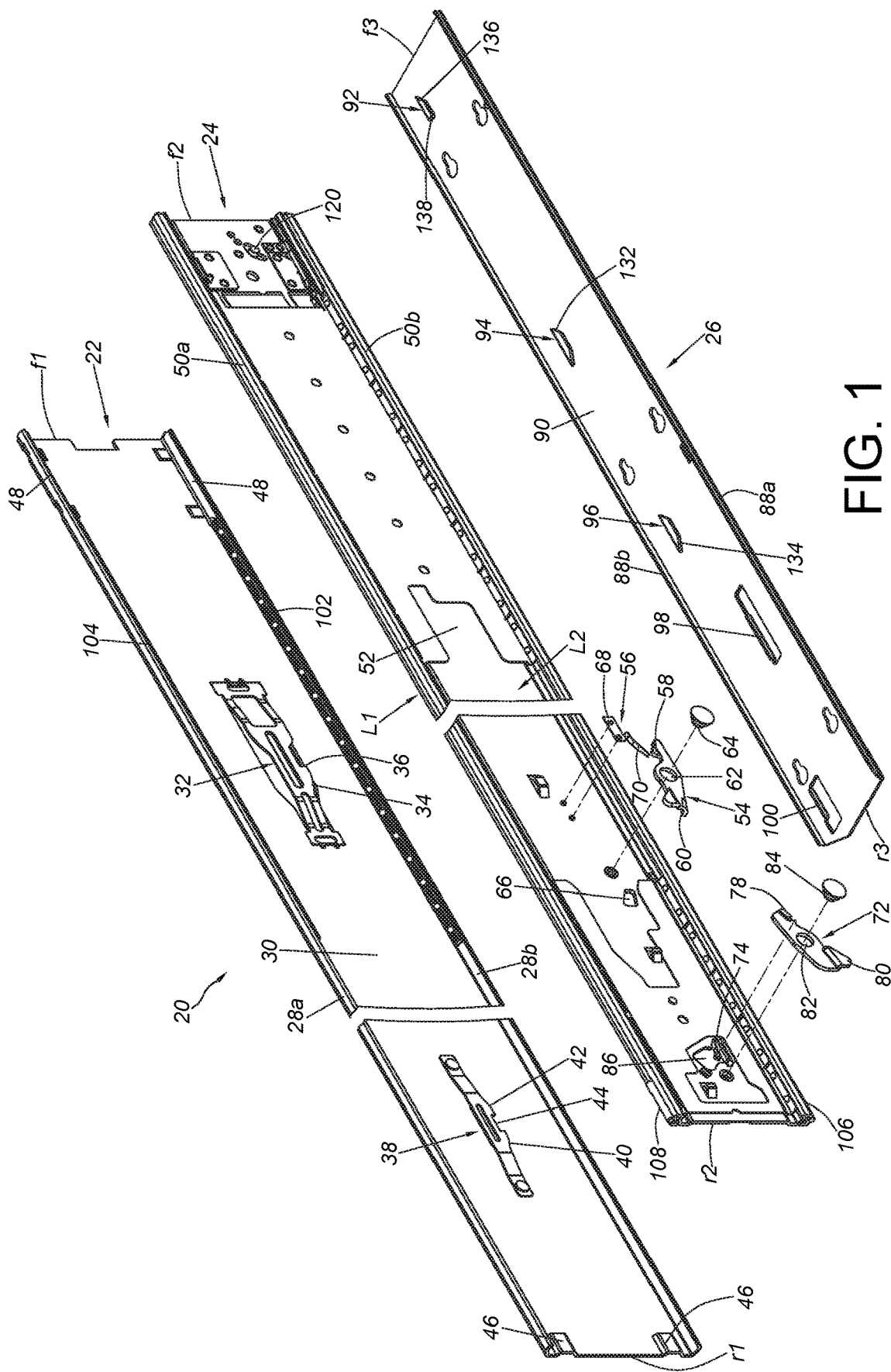
FIG. 1 is an exploded view of the slide rail assembly according to a first embodiment of the present invention.

As shown in FIG. 1, a slide rail assembly 20 comprises a first rail 22, a second rail 24 and a third rail 26 according to an embodiment of the present invention. The second rail 24 is movably mounted between the first rail 22 and the third rail 26. Moreover, the first rail 22 has a front end part f1 and a rear end part r1. The first rail 22 comprises an upper wall 28a, a lower wall 28b and a longitudinal wall 30 connected between the upper wall 28a and the lower wall 28b. A passage is defined by the upper wall 28a, the lower wall 28b and the longitudinal wall 30, and configured to accommodate the second rail 24.

Preferably, the slide rail assembly 20 further comprises a front base 32 arranged on the longitudinal wall 30 of the first rail 22, and the front base 32 comprises a guiding feature 34 and a blocking feature 36 adjacent to the guiding feature 34. In the present embodiment, the guiding feature 34 has an inclined surface or an arc surface.

Preferably, the slide rail assembly 20 further comprises a rear base 38 arranged on the longitudinal wall 30 of the first rail 22, and the rear base 38 comprises a first guiding section 40, a second guiding section 42 and an engaging section 44 located between the first guiding section 40 and the second guiding section 42. Each of the first guiding section 40 and the second guiding section 42 comprises an inclined surface or an arc surface, and the engaging section 44 is a notch, but the present invention is not limited thereto.

Preferably, the first rail 22 is arranged with at least one rear blocking part 46 and at least one front blocking part 48 respectively adjacent to the rear end part r1 and the front end part f1. In the present embodiment, the first rail 22 is arranged with two rear blocking parts 46 and two front blocking parts 48, but the present invention is not limited thereto.

The second rail 24 has a front end part f2 and a rear end part r2. The second rail 24 comprises an upper wall 50a, a lower wall 50b and a longitudinal wall 52 connected between the upper wall 50a and the lower wall 50b. A passage is defined by the upper wall 50a, the lower wall 50b and the longitudinal wall 52, and configured to accommodate the third rail 26. The second rail 24 has a first side L1 and a second side L2 opposite to the first side L1. The first side L1 of the second rail 24 faces the first rail 22, and the second side L2 of the second rail 24 faces the third rail 26.

Preferably, the slide rail assembly 20 further comprises a first engaging mechanism (front engaging mechanism) arranged on the longitudinal wall 52 of the second rail 24. The first engaging mechanism comprises a first engaging member 54 and a first elastic member 56 configured to provide an elastic force to the first engaging member 54. In the present embodiment, the first engaging member 54 comprises a supporting part 58, an engaging part 60 and a mounting feature 62 located between the supporting part 58 and the engaging part 60. The mounting feature 62 of the first engaging member 54 is pivotally connected to the second side L2 of the longitudinal wall 52 of the second rail 24 through a first pivoting member 64.

Preferably, the longitudinal wall 52 of the second rail 24 has a first through hole 66 communicated with the first side L1 and the second side L2 of the second rail 24. The engaging part 60 of the first engaging member 54 passes through the first through hole 66 from the second side L2 of the second rail 24 to extend to the first side L1 of the second rail 24. On the other hand, the first elastic member 56 has a main body part 68 and an elastic part 70 connected to the main body part 68. The main body part 68 is connected to the second side L2 of the longitudinal wall 52 of the second rail 24. The elastic part 70 is configured to elastically abut against the first engaging member 54, and the elastic part 70 is adjacent to the supporting part 58.

Preferably, the slide rail assembly 20 further comprises a second engaging mechanism (rear engaging mechanism) arranged on the longitudinal wall 52 of the second rail 24. The second engaging mechanism comprises a second engaging member 72 and a second elastic member 74 configured to provide an elastic force to the second engaging member 72. In the present embodiment, the second engaging member 72 comprises an engaging section 78, a supporting section 80 and a connecting feature 82 located between the engaging section 78 and the supporting section 80. The connecting feature 82 of the second engaging member 72 is pivotally connected to the second side L2 of the longitudinal wall 52 of the second rail 24 through a second pivoting member 84.

Preferably, the longitudinal wall 52 of the second rail 24 has a second through hole 86 communicated with the first side L1 and the second side L2 of the second rail 24. The engaging section 78 of the second engaging member 72 passes through the second through hole 86 from the second side L2 of the second rail 24 to extend to the first side L1 of the second rail 24. On the other hand, the second elastic member 74 is arranged on the longitudinal wall 52 of the second rail 24. The second elastic member 74 is configured to elastically abut against the second engaging member 72, and the second elastic member 74 is adjacent to the engaging section 78.

The third rail 26 has a front end part f3 and a rear end part r3. The third rail 26 comprises an upper wall 88a, a lower wall 88b and a longitudinal wall 90 connected between the upper wall 88a and the lower wall 88b. The longitudinal wall 90 of the third rail 26 is arranged with a driving structure 92, a front contact feature 94 and a rear contact feature 96, and the front contact feature 94 is located between the rear contact feature 96 and the driving structure 92.

Preferably, the longitudinal wall 90 of the third rail 26 is further arranged with a working feature 98 and a supporting feature 100. The driving structure 92, the front contact feature 94, the rear contact feature 96, the working feature 98 and the supporting feature 100 are protrusions protruded from the longitudinal wall 90 of the third rail 26 to face toward the second side L2 of the second rail 24, but the present invention is not limited thereto. A slide assisting device is arranged between each two adjacent rails of the slide rail assembly 20 to improve smoothness of relative longitudinal movement of the two adjacent rails. For example, a lower bearing retainer 102 and an upper bearing retainer 104 are arranged inside the passage of the first rail 22 and configured to respectively support the lower wall 50b and the upper wall 50a of the second rail 24. The lower wall 50b and the upper wall 50a of the second rail 24 are further arranged with a lower pushing part 106 and an upper pushing part 108 respectively configured to abut against rear ends of the lower bearing retainer 102 and the upper bearing retainer 104.

Figure 2:
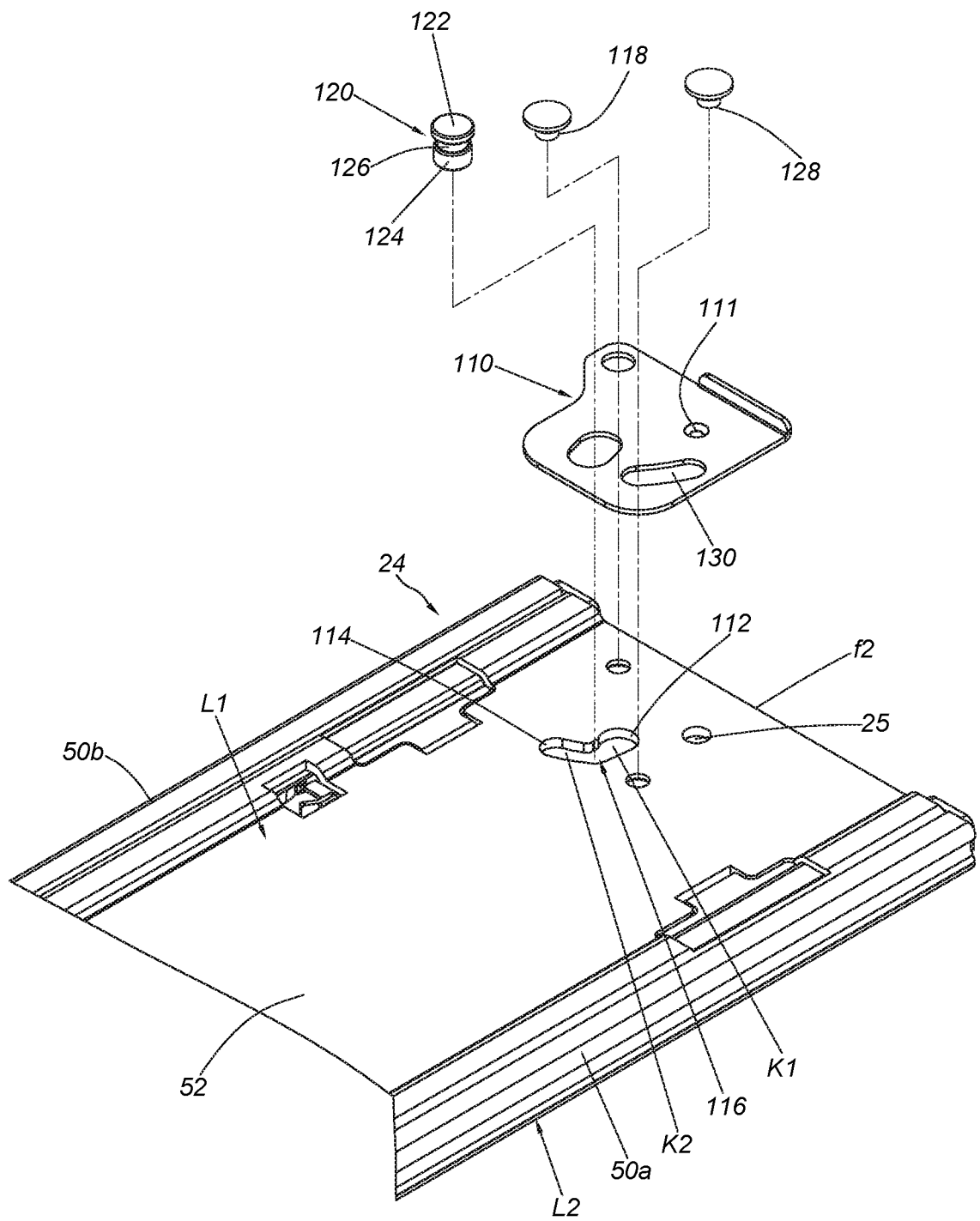
FIG. 2 is an exploded view of a second rail and a switch member according to the first embodiment of the present invention.
Figure 4:
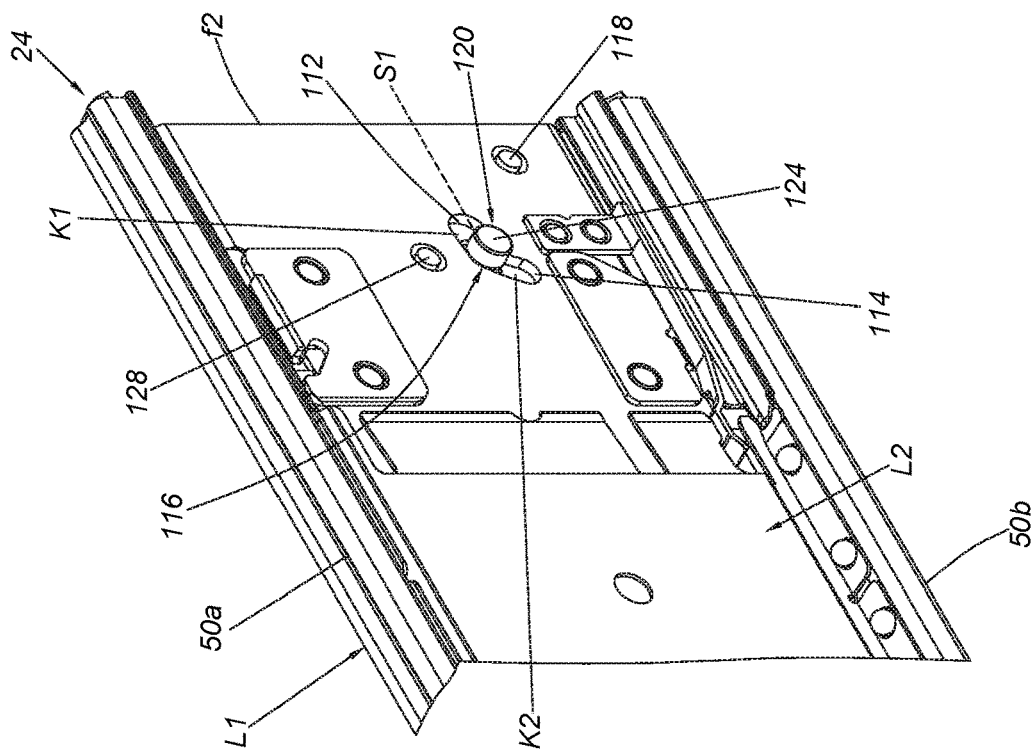
FIG. 4 is a diagram showing the switch member being in the first state from another viewing angle according to the first embodiment of the present invention.
Figure 3:
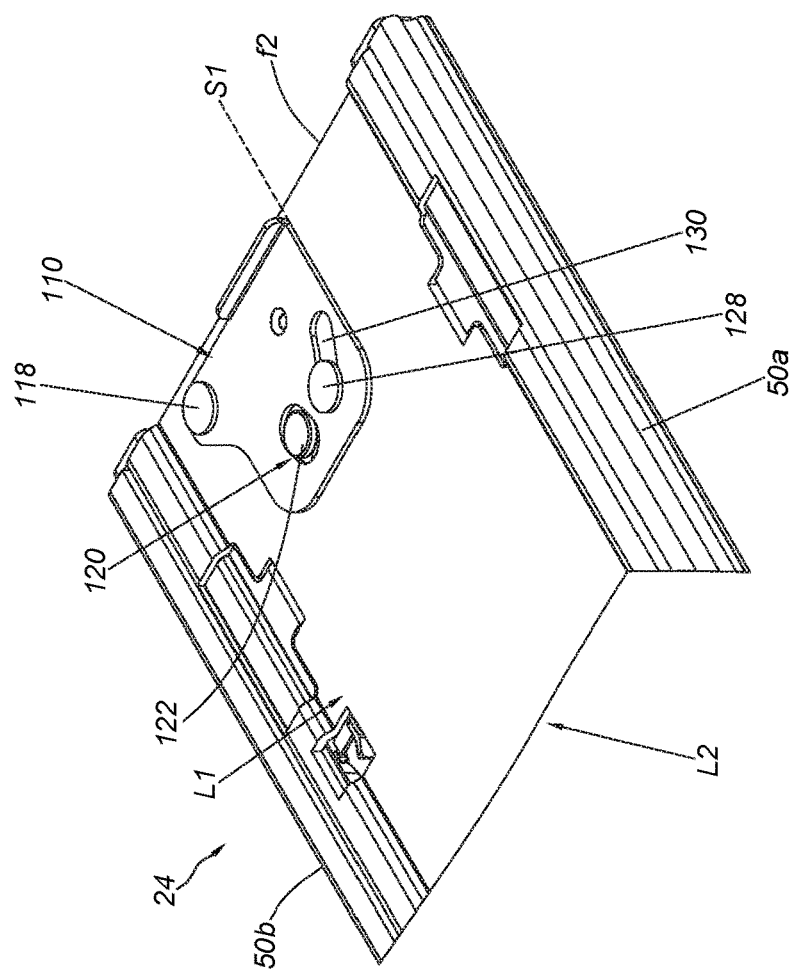
FIG. 3 is a diagram showing the switch member being in a first state according to the first embodiment of the present invention.

As shown in FIG. 2 to FIG. 4, the slide rail assembly 20 further comprises a switch member 110 movably arranged on the second rail 24 according to an embodiment of the present invention. In the present embodiment, the switch member 110 is movably arranged on the second rail 24 and adjacent to the front end part f2 of the second rail 24, but the present invention is not limited thereto. On the other hand, the second rail 24 has a first limiting part 112, a second limiting part 114 and a space 116 defined between the first limiting part 112 and the second limiting part 114. The space 116 is communicated with the first side L1 and the second side L2 of the second rail 24.

Preferably, the switch member 110 is pivotally connected to the first side L1 of the second rail 24 through a shaft member 118. The switch member 110 is arranged with a switch part 120 extending to the second side L2 of the second rail 24.

Preferably, the space 116 is a hole defined by an arc-shaped hole wall of the longitudinal wall 52 of the second rail 24. In addition, the space 116 has a first accommodating part K1 and a second accommodating part K2 communicated with each other. The switch member 110 is arranged with a holding feature 111, and the second rail 24 is arranged with a matching feature 25. The holding feature 111 and the matching feature 25 are a combination of convex and concave structures matching each other, but the present invention is not limited thereto.

Figure 6:
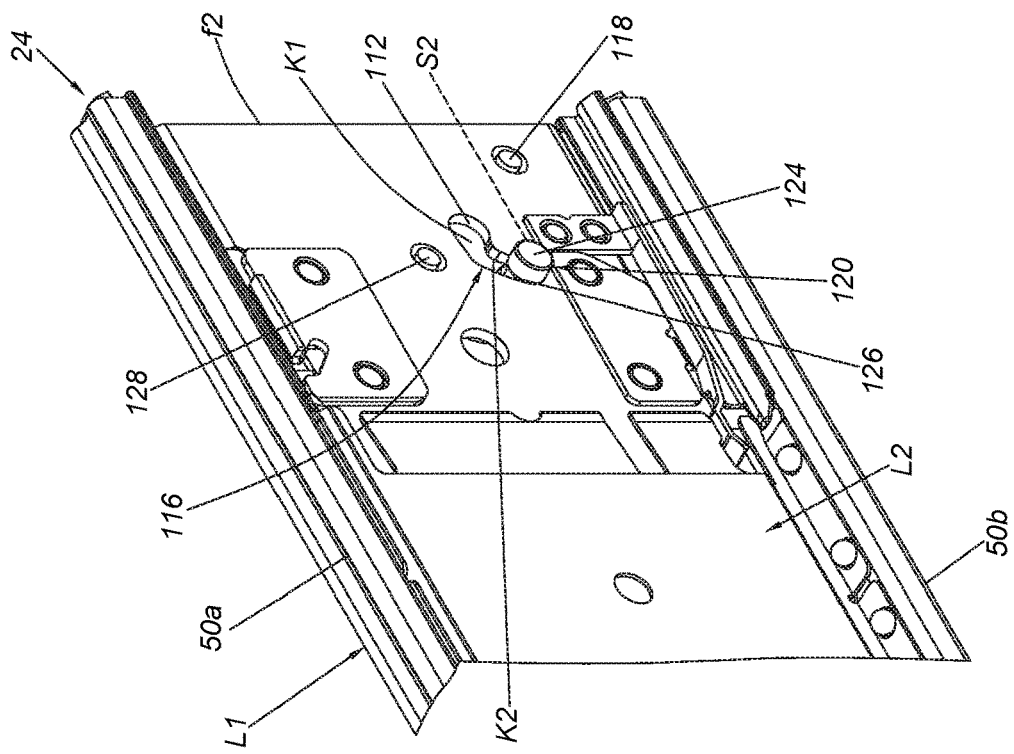
FIG. 6 is a diagram showing the switch member being in the second state from another viewing angle according to the first embodiment of the present invention.
Figure 5:
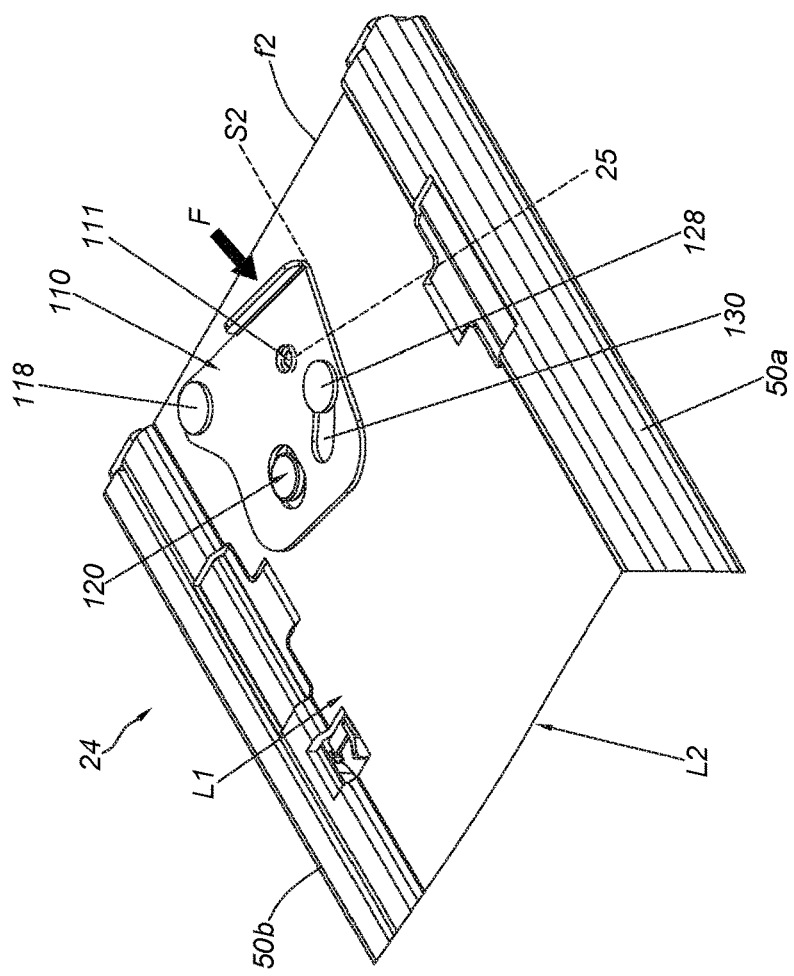
FIG. 5 is a diagram showing the switch member being in a second state according to the first embodiment of the present invention.

Preferably, the switch member 110 is movable relative to the second rail 24 to be in one of a first state S1 (as shown in FIG. 3 and FIG. 4) and a second state S2 (as shown in FIG. 5 and FIG. 6).

Preferably, the switch part 120 of the switch member 110 has a first head part 122, a second head part 124 and a body part 126 connected between the first head part 122 and the second head part 124. The first head part 122 is located at the first side L1 of the second rail 24, the second head part 124 is located at the second side L2 of the second rail 24, and the body part 126 is supported by the arc-shaped hole wall at the first accommodating part K1 and the second accommodating part K2. When the switch member 110 is in the first state S1, the switch part 120 of the switch member 110 is located in the first accommodating part K1 of the space 116.

Preferably, the switch member 110 is further connected to the second rail 24 through an auxiliary shaft member 128, and the switch member 110 is arranged with a bounded auxiliary guiding hole 130. A contour of the auxiliary guiding hole 130 is substantially in an arc shape. The auxiliary shaft member 128 passes through a portion of the auxiliary guiding hole 130. The auxiliary shaft member 128 and the auxiliary guiding hole 130 are configured to assist the switch member 110 in moving relative to the second rail 24 within a limited range.

As shown in FIG. 5 and FIG. 6, a user can apply a force F to the switch member 110 to switch the switch member 110 from the first state S1 to the second state S2. When the switch member 110 is in the second state S2, the switch part 120 of the switch member 110 is located in the second accommodating part K2 of the space 116, and the holding feature 111 and the matching feature 25 abut against each other to hold the switch member 110 in the second state S2.

Figure 7:
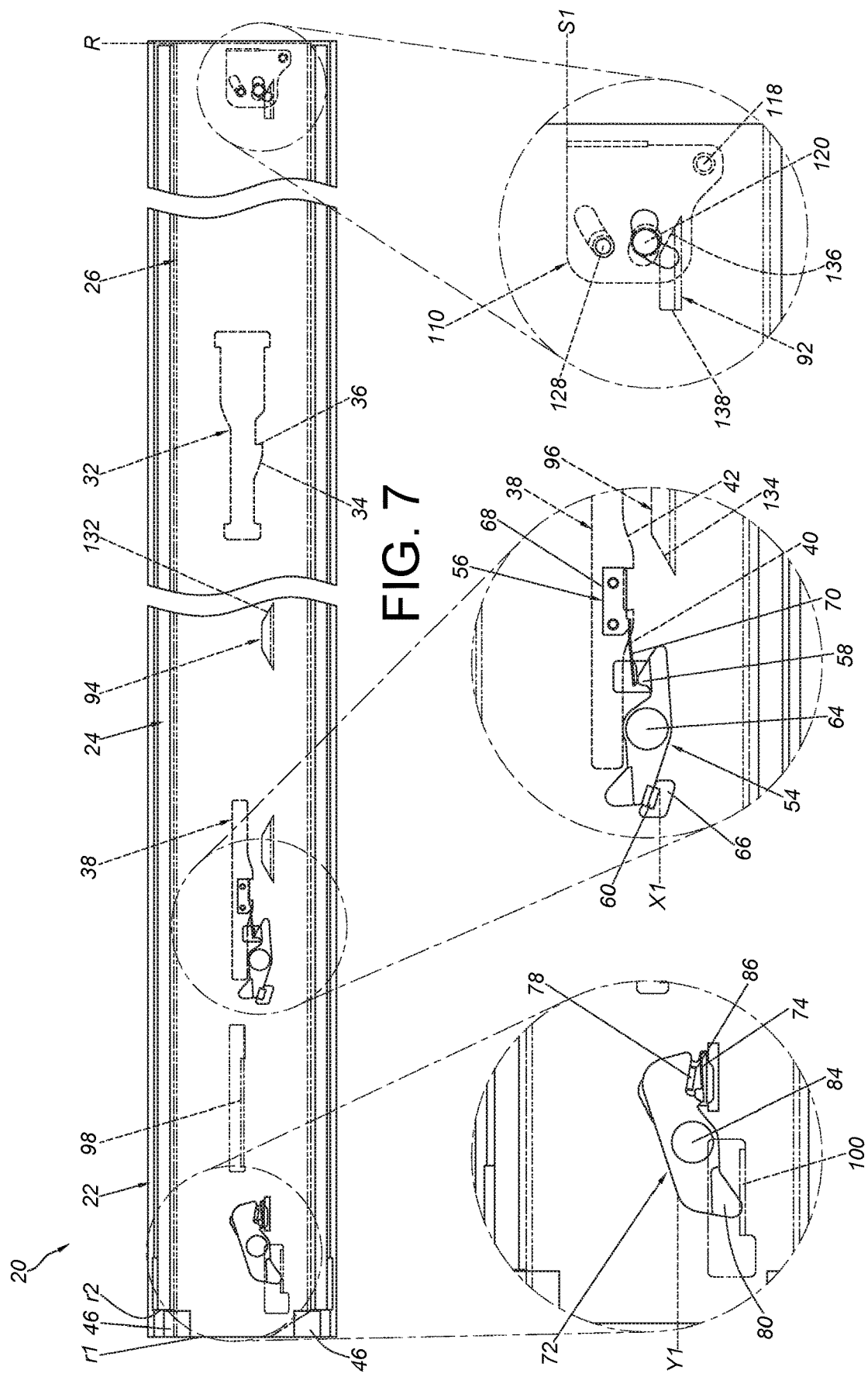
FIG. 7 is a diagram showing internal components of the slide rail assembly being in a retracted state according to the first embodiment of the present invention.

As shown in FIG. 7, the slide rail assembly 20 is in a retracted state (the third rail 26 is located at a fully-retracted position R). The rear blocking part 46 of the first rail 22 is configured to block the rear end part r2 of the second rail 24.

Furthermore, the rear base 38 is apart from the front base 32. The first engaging member 54 is held in a first predetermined state X1 in response to the elastic force of the first elastic member 56, and the engaging part 60 of the first engaging member 54 is located at a position corresponding to the guiding feature 34 of the front base 32. The supporting section 80 of the second engaging member 72 is configured to be supported by the supporting feature 100 of the third rail 26, in order to hold the second engaging member 72 in an initial state Y1, such that the engaging section 78 of the second engaging member 72 is misaligned with the rear base 38. In the meantime, the second elastic member 74 accumulates an elastic force. Moreover, when the switch member 110 is in the first state S1, the switch part 120 of the switch member 110 is not located at the same horizontal position as the driving structure 92, the front contact feature 94 and the rear contact feature 96 of the third rail 26.

Preferably, one of the front contact feature 94 of the third rail 26 and the switch part 120 of the switch member 110 has a guiding surface. In the present embodiment, the front contact feature 94 has a guiding surface 132, and the switch part 120 is a cylinder. The guiding surface 132 can be an inclined surface or an arc surface, but the present invention is not limited thereto.

Preferably, one of the rear contact feature 96 of the third rail 26 and the switch part 120 of the switch member 110 has a guiding surface. In the present embodiment, the rear contact feature 96 has a guiding surface 134. The guiding surface 134 can be an inclined surface or an arc surface, but the present invention is not limited thereto.

Preferably, one of the driving structure 92 of the third rail 26 and the switch part 120 of the switch member 110 has a guiding surface. In the present embodiment, the driving structure 92 has a guiding surface 136. The guiding surface 136 can be an inclined surface or an arc surface, but the present invention is not limited thereto. In addition, the driving structure 92 further has a contact wall 138 (such as a vertical wall).

Figure 8:
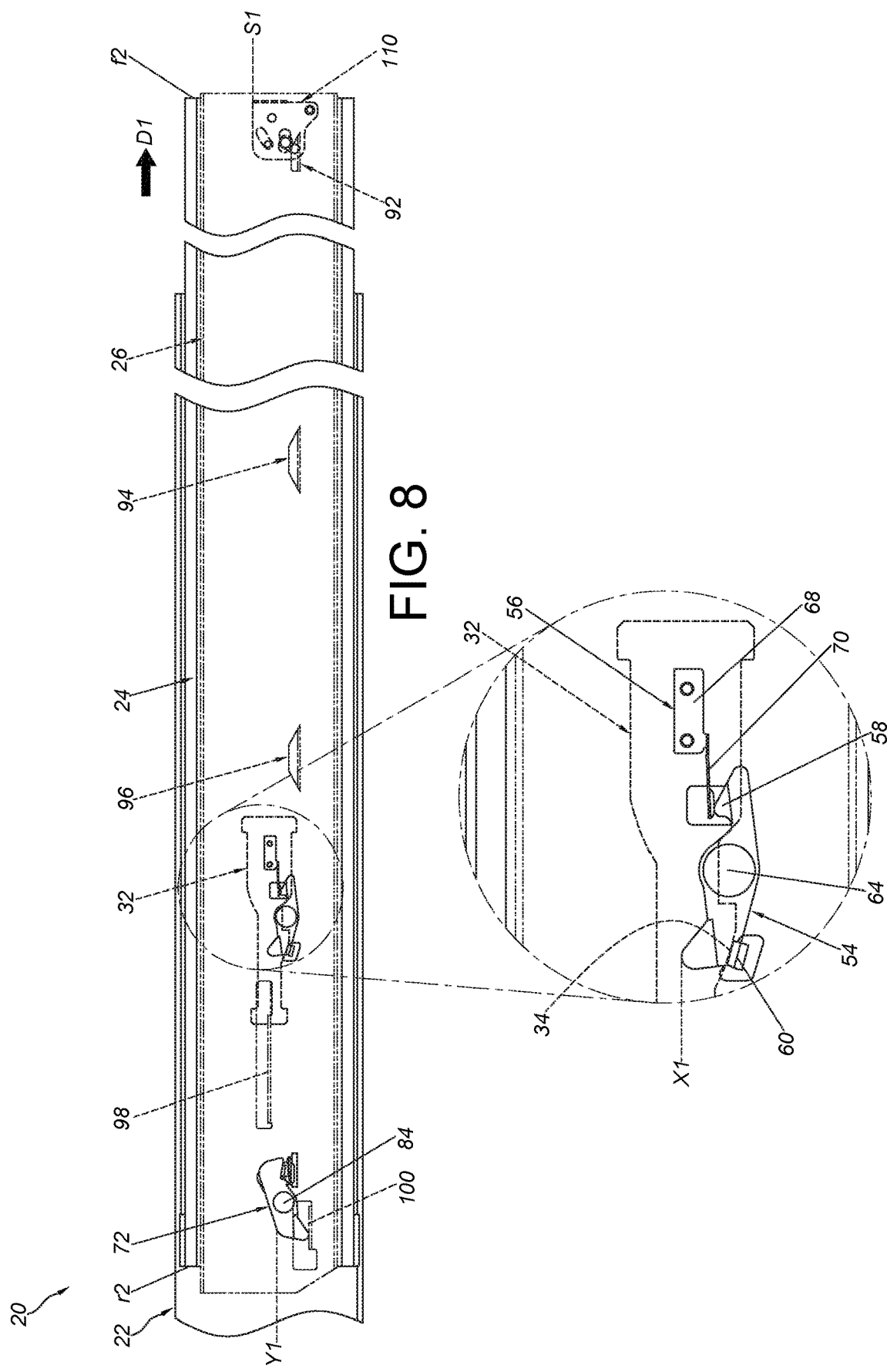
FIG. 8 is a diagram showing the slide rail assembly being moved along an extending direction according to the first embodiment of the present invention.

As shown in FIG. 8, when the second rail 24 is moved relative to the first rail 22 along an extending direction D1 to one position, the engaging part 60 of the first engaging member 54 is configured to contact the guiding feature 34 of the front base 32.

Figure 9:
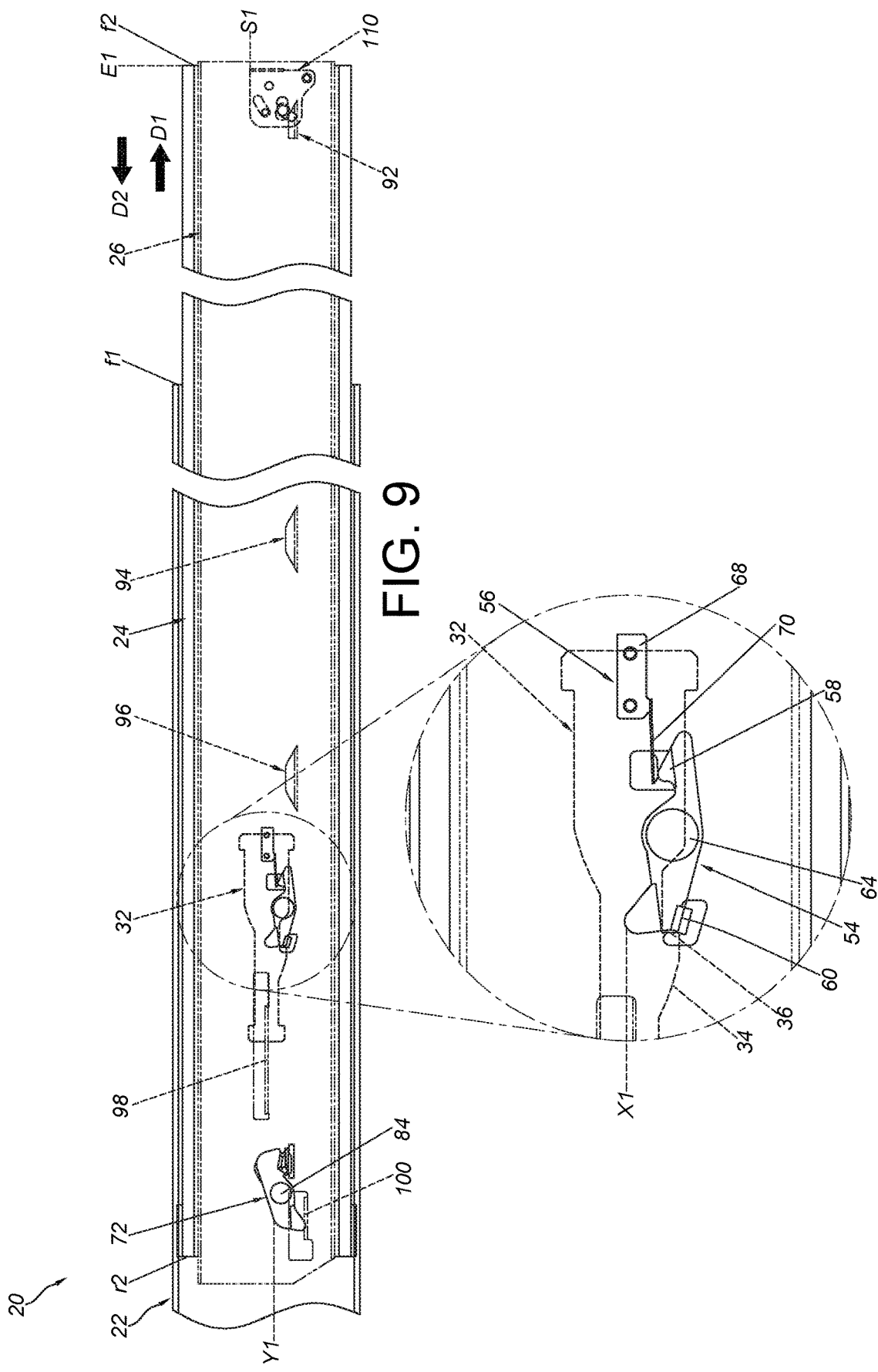
FIG. 9 is a diagram showing the second rail of the slide rail assembly being located at a first extended position according to the first embodiment of the present invention.

As shown in FIG. 9, when the second rail 24 is further moved relative to the first rail 22 along the extending direction D1, the engaging part 60 of the first engaging member 54 is guided by the guiding feature 34 of the front base 32, and the first engaging member 54 is deflected accordingly. The first elastic member 56 accumulates an elastic force in response to deflection of the first engaging member 54. When the second rail 24 is moved relative to the first rail 22 to a first extended position E1 and the engaging part 60 of the first engaging member 54 crosses the guiding feature 34, the elastic part 70 of the first elastic member 56 releases the elastic force immediately to allow the first engaging member 54 to return to the first predetermined state X1. In the meantime, the engaging part 60 of the first engaging member 54 is blocked by the blocking feature 36 of the front base 32, in order to prevent the second rail 24 from being moved from the first extended position E1 along a retracting direction D2.

Figure 10:
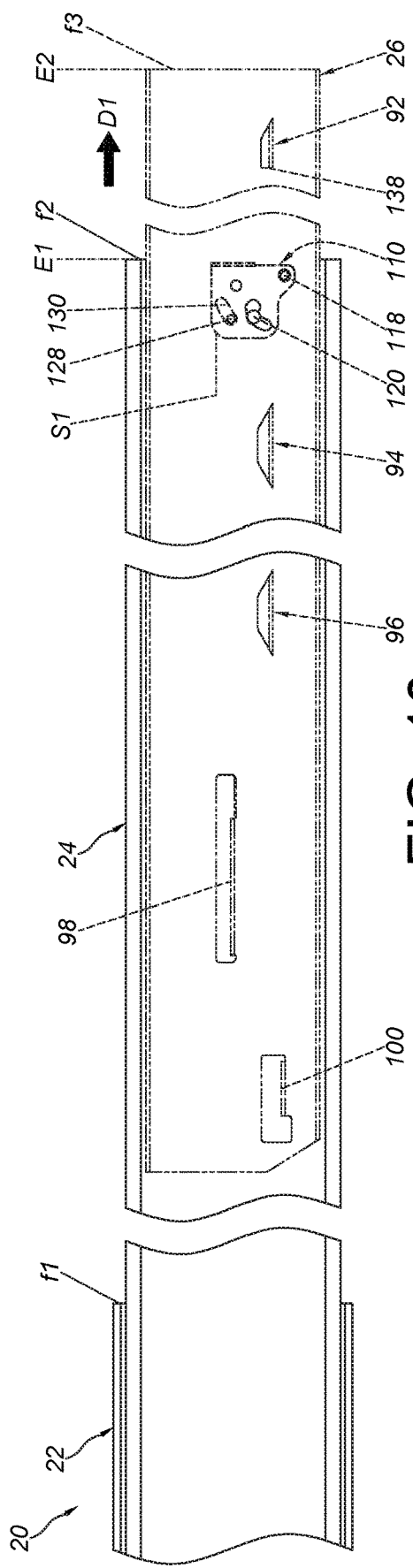
FIG. 10 is a diagram showing the slide rail assembly being in an extended state with the switch member being in the first state according to the first embodiment of the present invention.
Figure 11:
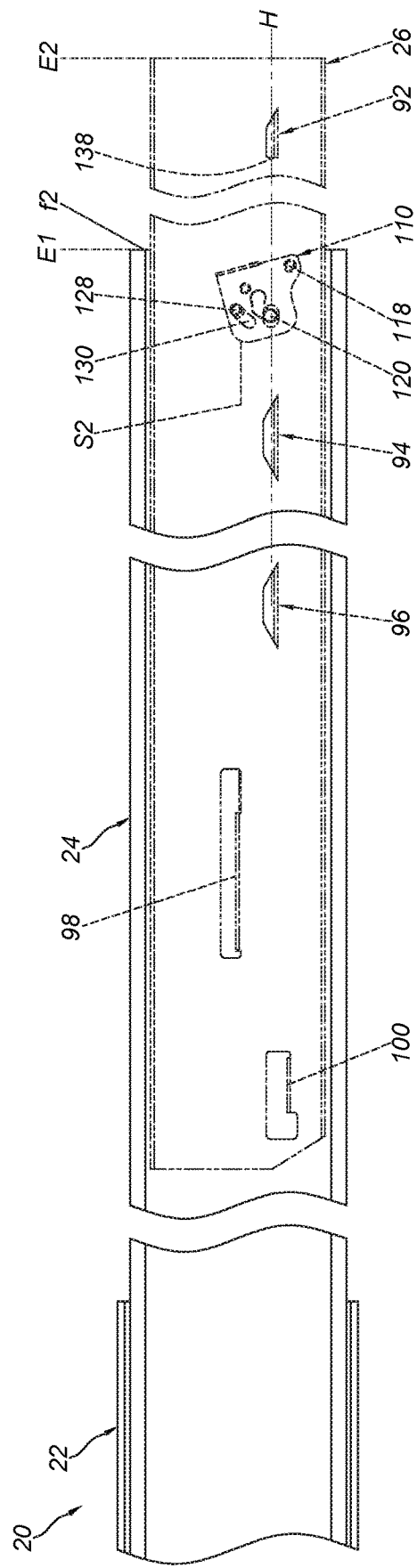
FIG. 11 is a diagram showing the slide rail assembly being in the extended state with the switch member being in the second state according to the first embodiment of the present invention.

As shown in FIG. 10 and FIG. 11, when the second rail 24 is located at the first extended position E1 relative to the first rail 22, the third rail 26 can be further moved relative to the second rail 24 along the extending direction D1 to a second extended position E2. In the meantime, the slide rail assembly 20 is in a fully extended state.

Furthermore, when the second rail 24 is located at the first extended position E1 relative to the first rail 22, the switch member 110 can be manually switched from the first state S1 to the second state S2. When the switch member 110 is in the second state S2, the switch part 120 of the switch member 110 is located at the substantially same horizontal position H as the driving structure 92, the front contact feature 94 and the rear contact feature 96 of the third rail 26 (as shown in FIG. 11).

Moreover, as shown in FIG. 12 and FIG. 13, when the third rail 26 is moved relative to the second rail 24 so that the supporting feature 100 no longer supports the supporting section 80 of the second engaging member 72, the second engaging member 72 is switched from the initial state Y1 to an non-initial state Y2 in response to the elastic force of the second elastic member 74. In addition, the first engaging member 54 further comprises a disengaging part 140 adjacent to the engaging part 60. Preferably, one of the disengaging part 140 and the working feature 98 has an inclined surface or an arc surface. In the present embodiment, the disengaging part 140 has an inclined surface (or an arc surface), but the present invention is not limited thereto.

As shown in FIG. 11 to FIG. 13, the switch member 110 is in the second state S2. When the third rail 26 is moved a distance from the second extended position E2 relative to the second rail 24 at the first extended position E1 along the retracting direction D2, the working feature 98 of the third rail 26 contacts the disengaging part 140 of the first engaging member 54 to generate a working force, such that the first engaging member 54 is rotated from the first predetermined state X1 (as shown in FIG. 12) to a second predetermined state X2 (as shown in FIG. 13) in response to the working force. As such, the engaging part 60 of the first engaging ember 54 is no longer blocked by the blocking feature 36 of the front base 32, so as to allow the second rail 24 to be moved from the first extended position E1 along the retracting direction D2. When the third rail 26 is moved from the second extended position E2 along the retracting direction D2, the contact wall 138 of the driving structure 92 contacts the switch part 120 of the switch member 110 in the second state S2, such that the third rail 26 is configured to drive the second rail 24 to move along the retracting direction D2.

As shown in FIG. 14 to FIG. 15, the second engaging member 72 further comprises a disengaging section 142 adjacent to the supporting section 80. Preferably, one of the disengaging section 142 and the supporting feature 100 has an inclined surface or an arc surface. In the present embodiment, the disengaging section 142 has an inclined surface (or an arc surface), but the present invention is not limited thereto.

When the third rail 26 is moved along the retracting direction D2, the contact wall 138 of the driving structure 92 contacts the switch part 120 of the switch member 110 in the second state S2, such that the third rail 26 can drive the second rail 24 to move along the retracting direction D2 to a predetermined position P (as shown in FIG. 15). When the second rail 24 is located at the predetermined position P, the second rail 24 is engaged with the rear base 38 through the second engaging mechanism.

Specifically, during a process of the second rail 24 being moved to the predetermined position P along the retracting direction D2, the engaging section 78 of the second engaging member 72 in the non-initial state Y2 contacts the second guiding section 42 of the rear base 38 (as shown in FIG. 14) to generate a working force, such that the second engaging member 72 is rotated to be no longer in the non-initial state Y2, and the second elastic member 74 accumulates an elastic force. When the second rail 24 is located at the predetermined position P, the second engaging member 72 returns to the non-initial state Y2 in response to the elastic force of the second elastic member 74, such that the engaging section 78 of the second engaging member 72 is engaged with the engaging section 44 of the rear base 38 (as shown in FIG. 15) in order to prevent the second rail 24 from being moved relative to the first rail 22 from the predetermined position P along the extending direction D1 or the retracting direction D2.

Moreover, when the second rail 24 is located at the predetermined position P relative to the first rail 22, the engaging section 78 of the second engaging member 72 is engaged with the engaging section 44 of the rear base 38. In the meantime, a total length of the slide rail assembly 20 is reduced and the second rail 24 is in a locked state. Therefore, the slide rail assembly 20 requires a smaller space to pull out the third rail 26 of the slide rail assembly 20 relative to the second rail 24 along the extending direction D1, so as to facilitate use in a limited space. On the other hand, when the second rail 24 is located at the predetermined position P and the driving structure 92 of the third rail 26 contacts the switch member 110 in the second state S2, the third rail 26 is prevented from being moved relative to the second rail 24 along the retracting direction D2.

As shown in FIG. 16 to FIG. 18, when the second rail 24 is located at the position P relative to the first rail 22, the third rail 26 can be moved relative to the second rail 24 along the extending direction D1. When the third rail 26 is moved a predetermined extended distance along the extending direction D1, the guiding surface 132 of the front contact feature 94 contacts the switch part 120 of the switch member 110, such that the third rail 26 is configured to drive the switch member 110 to switch from the second state S2 (as shown in FIG. 16) to the first state S1 (as shown in FIG. 17), and the third rail 26 can be further detached from the second rail 24 located at the predetermined position P along the extending direction D1 (as shown in FIG. 18).

Therefore, when the third rail 26 is moved relative to the second rail 24 at the predetermined position P along the extending direction D1, the third rail 26 can drive the switch member 110 to switch from the second state S2 to the first state S1 through the front contact feature 94, so as to ensure that the switch member 110 is in the first state S1. Especially, when the third rail 26 is detached from the second rail 24 along the extending direction D1, it can be ensure that the switch member 110 is in the first state S1.

As shown in FIG. 18 and FIG. 19, after the third rail 26 is detached from the passage of the second rail 24 along the extending direction D1, the switch member 110 is in the first state S1 (as shown in FIG. 18). However, if the switch member 110 is accidentally switched from the first state S1 to the second state S2 (as shown in FIG. 19) due to other factors (such as an external force), the third rail 26 can drive the switch member 110 to switch from the second state S2 to the first state S1 through the rear contact feature 96 during a process of the third rail 26 being remounted to the passage of the second rail 24 along the retracting direction D2.

As shown in FIG. 19 to FIG. 21, during the process of the third rail 26 being remounted to the passage of the second rail 24, the third rail 26 is configured to drive the switch member 110 to switch from the second state S2 (as shown in FIG. 20) to the first state S1 (as shown in FIG. 21) through the guiding surface 134 of the rear contact feature 96 contacting the switch part 120 of the switch member 110.

Figure 22:
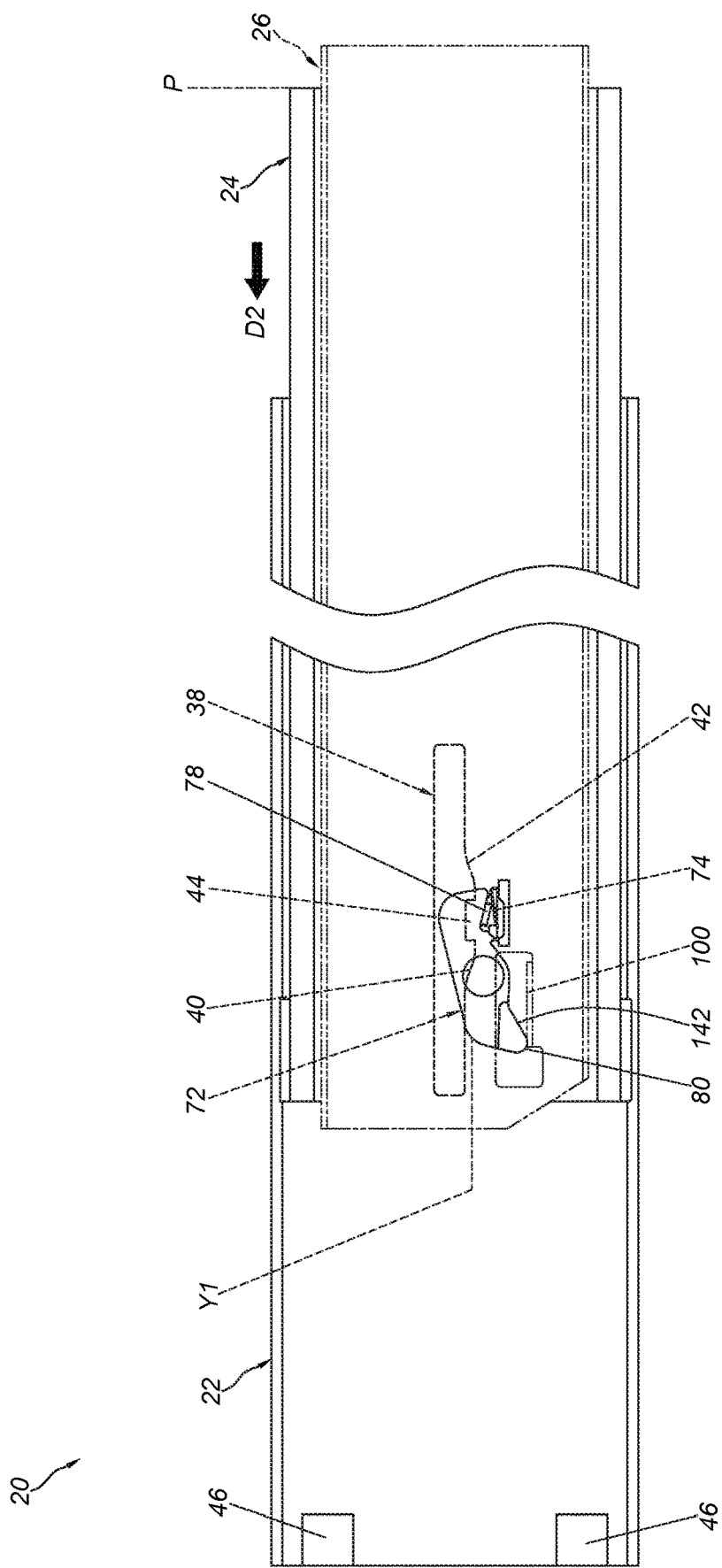
FIG. 22 is a diagram showing the third rail being moved along the retracting direction to disengage a second engaging member from the first rail according to the first embodiment of the present invention.

As shown in FIG. 15 and FIG. 22, when the third rail 26 is moved relative to the second rail 24 at the predetermined position P along the retracting direction D2, the supporting feature 100 of the third rail 26 contacts the disengaging section 142 of the second engaging member 72 to generate a working force, such that the second engaging member 72 is switched from the non-initial state Y2 (as shown in FIG. 15) to the initial state Y1 (as shown in FIG. 22), and the supporting feature 100 of the third rail 26 is configured to support the supporting section 80 of the second engaging member 72 once again to hold the second engaging member 72 in the initial state Y1. Thereby, the engaging section 78 of the second engaging member 72 is no longer engaged with the engaging section 44 of the rear base 38, so as to allow the second rail 24 to retract relative to the first rail 22 from the predetermined position P along the retracting direction D2. Since the switch member 110 is switched to the first state S1, the third rail 26 can be moved relative to the second rail 24 along the retracting direction D2 to the fully-retracted position R (please refer to FIG. 7).

Therefore, when the switch member 110 is in the first state S1 (as shown in FIG. 21), the third rail 26 can be moved relative to the second rail 24 along the retracting direction D2 to the fully-retracted position R (please refer to FIG. 7).

As shown in FIG. 23 to FIG. 25, according to aforementioned arrangement, the slide rail assembly 20 of the present invention is applicable in a narrow space. The first rail 22 is configured to be mounted to a rack (not shown in figures). The third rail 26 is configured to a carry a carried object 144. When the second rail 24 is located at the first extended position E1 relative to the first rail 22, the slide rail assembly 20 has a first length M1. The third rail 26 can be moved relative to the second rail 24 along the extending direction D1 to the second extended position E2 (as shown in FIG. 23), and a first space W1 is formed between the front end part f3 of the third rail 26 (or the carried object 144) and an obstruction 146 (such as a wall, a door or other surrounding obstruction). However, if the first space W1 is too narrow, an on-site user cannot smoothly perform related maintenance operations on the carried object 144 or the slide rail assembly 20. Therefore, the user can move the second rail 24 relative to the first rail 22 from the first extended position E1 to the predetermined position P along the retracting direction D2 (please refer to FIG. 24 and FIG. 15), such that a second space W2 wider than the first space W1 is formed between the front end part f3 of the third rail 26 and the obstruction 146, in order to allow the on-site user to smoothly perform detachment of the carried object 144 or related maintenance operations of the slide rail assembly 20. When the second rail 24 is located at the predetermined position P relative to the first rail 22, the slide rail assembly 20 is shortened to a second length M2, and the second length M2 is smaller than the first length M1. When the second rail 24 is located at the predetermined position P relative to the first rail 22, the third rail 26 can be detached from the second rail 24 along the extending direction D1.

As shown in FIG. 26 and FIG. 27, a slide rail assembly comprises a first rail 202, a second rail 204 and a third rail 206 according to a second embodiment of the present invention. Different from the first embodiment, a rear base 208 of the second embodiment comprises a first base part 210 and a second base part 212, and a second engaging member 214 of the second engaging mechanism is linearly movable relative to the second rail 204 along a linear direction A1 (or a height direction). The linear direction A1 is substantially perpendicular to a longitudinal direction A2 (or moving direction) of the second rail 204, so as to provide more stable engagement.

Preferably, the second rail 204 has a linear feature 205 (such as a bounded elongated hole or a bounded elongated groove, but the present invention is not limited thereto). The second engaging member 214 can be a cylinder movably mounted to a portion of the linear feature 205. A second elastic member 216 of the second engaging mechanism is configured to provide an elastic force to the second engaging member 214. During a process of the second rail 204 being moved from the first extended position E1 to the predetermined position P along the retracting direction D2, the second engaging member 214 is configured to contact a second guiding section 218 of the first base part 210 of the rear base 208 (as shown in FIG. 26) to move upward and generate a working force, such that the second elastic member 216 accumulates an elastic force (as shown in FIG. 26). When the second rail 204 is located at the predetermined position P (as shown in FIG. 27), the second engaging member 214 is moved downward to be blocked between the first base part 210 and the second base part 212 of the rear base 208 in response to the elastic force of the second elastic member 216, so as to prevent the second rail 204 from being moved relative to the first rail 202 from the predetermined position P along the extending direction D1 or the retracting direction D2. Moreover, one of the a supporting feature 220 of the third rail 206 and the second engaging member 214 has a guiding structure 222 (such as an inclined surface or an arc surface, but the present invention is not limited thereto). In the present embodiment, the supporting feature 220 of the third rail 206 has the guiding structure 222. During a process of the third rail 206 being moved along the retracting direction D2, the guiding structure 222 pushes the second engaging member 214 upward to move the second engaging member 214 away from the position between the first base part 210 and the second base part 212 of the rear base 208, such that the second engaging member 214 is no longer blocked between the first base part 210 and the second base part 212 of the rear base 208.

FIG. 28 and FIG. 29 are diagrams showing a slide rail assembly according to a third embodiment of the present invention. Different from the first embodiment and the second embodiment, a switch member 300 of the third embodiment is linearly movable relative to the second rail 204, such as being linearly movable in the linear direction A1 (or the height direction), to be in one of the first state S1 and the second state S2.

Preferably, the linear direction A1 is substantially perpendicular to the longitudinal direction A2 of the second rail 204. The switch member 300 can be a cylinder and arranged with a switch part 302 located at the second side L2 of the second rail 204. When the switch member 300 is in the second state S2, the switch part 302 of the switch member 300 is located at the substantially same horizontal position H as the driving structure 92, the front contact feature 94 and the rear contact feature 96 of the third rail 206. One of the front contact feature 94 of the third rail 206 and the switch part 302 of the switch member 300 has the guiding surface 132. The second rail 204 is arranged with at least one holding feature 304 made of a flexible material. The holding feature 304 is configured to elastically support the switch member 300 to temporarily hold the switch member 300 in the first state S1.

Therefore, the slide rail assembly 20 according to embodiments of the present invention is characterized in that: the switch member 110, 300 can be switched with a fool-proof function by pulling out or re-inserting a slide rail. That is, the user can switch the switch member 110, 300 from the second state S2 to the first state S1 without manually moving the switch member 110, 300. According to such arrangement, while the slide rail assembly 20 is applied in the narrow space, it is ensured that the third rail 26 can be moved relative to the second rail 24 along the retracting direction D2 to the fully-retracted position R. On the other hand, the second engaging member 214 of the second engaging mechanism is linearly movable relative to the second rail 204 along the linear direction A1 (or the height direction). The linear direction A1 is substantially perpendicular to the longitudinal direction A2 of the second rail 204, so as to provide more stable engagement.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail;
   a second rail movable relative to the first rail;
   a rear base arranged on the first rail, the rear base comprising a first base part and a second base part; and
   a rear engaging mechanism arranged on the second rail, the rear engaging mechanism comprising an engaging member linearly movable relative to the second rail along a linear direction;
   wherein when the second rail is located at a predetermined position relative to the first rail, the engaging member of the rear engaging mechanism is blocked by the first base part of the rear base, in order to prevent the second rail from being moved from the predetermined position along an extending direction;
   wherein when the second rail is located at the predetermined position, the engaging member of the rear engaging mechanism is blocked by the second base part of the rear base, in order to prevent the second rail from being moved from the predetermined position along a retracting direction;
   wherein the slide rail assembly further comprises a third rail movable relative to the second rail, and a switch member movable relative to the second rail to be in one of a first state and a second state; wherein the third rail is arranged with a driving structure and a front contact feature; wherein when the second rail is located at a first extended position relative to the first rail, the switch member is operable to switch from the first state to the second state; wherein when the third rail is moved along the retracting direction, the driving structure of the third rail is configured to contact the switch member in the second state to allow the third rail to drive the second rail to move to the predetermined position along the retracting direction; wherein when the third rail is moved a predetermined extended distance relative to the second rail at the predetermined position along the extending direction, the third rail is configured to drive the switch member to switch from the second state to the first state through the front contact feature.

2. The slide rail assembly of claim 1, wherein the rear engaging mechanism further comprises an elastic member configured to provide an elastic force to the engaging member; wherein when the second rail is located at the predetermined position, the engaging member is moved to be blocked between the first base part and the second base part of the rear base in response to the elastic force of the elastic member.

3. The slide rail assembly of claim 1, wherein the linear direction is substantially perpendicular to a longitudinal direction of the second rail.

4. A slide rail assembly, comprising:
   a first rail;
   a second rail movable relative to the first rail;
   a third rail movable relative to the second rail; and
   a switch member linearly movable relative to the second rail to be in one of a first state and a second state;
   wherein when the second rail is located at a predetermined position relative to the first rail, the third rail is configured to drive the switch member to switch from the second state to the first state during the third rail being moved a predetermined extended distance relative to the second rail at the predetermined position along an extending direction;
   wherein the slide rail assembly further comprises a rear base arranged on the first rail, and an engaging mechanism arranged on the second rail; wherein the engaging mechanism comprises an engaging member linearly movable relative to the second rail along a linear direction; wherein when the second rail is located at a predetermined position, the engaging member of the engaging mechanism is blocked by the rear base, in order to prevent the second rail from being moved from the predetermined position along the extending direction.

5. A slide rail assembly, comprising:
   a first rail;
   a second rail movable relative to the first rail;
   a third rail movable relative to the second rail, the third rail being arranged with a driving structure and a front contact feature; and a switch member linearly movable relative to the second rail along a linear direction to be in one of a first state and a second state;

wherein when the second rail is located at a first extended position relative to the first rail, the switch member is operable to switch from the first state to the second state;

wherein when the third rail is moved along a retracting direction, the driving structure of the third rail is configured to contact the switch member in the second state to allow the third rail to drive the second rail to move to a predetermined position along the retracting direction;

wherein when the third rail is moved a predetermined extended distance relative to the second rail at the predetermined position along an extending direction, the third rail is configured to drive the switch member to switch from the second state to the first state through the front contact feature;

wherein the third rail is further arranged with a rear contact feature; wherein when the third rail is detached from a passage of the second rail along the extending direction and when the switch member is switched from the first state to the second state, the third rail is configured to drive the switch member to switch from the second state to the first state through the rear contact feature during a process of the third rail being remounted to the passage of the second rail along the retracting direction.

6. The slide rail assembly of claim 5, wherein when the switch member is in the first state, the driving structure of the third rail is spaced from the switch member, so as to allow the third rail to be moved relative to the second rail along the retracting direction to a fully-retracted position.

7. The slide rail assembly of claim 5, wherein the second rail is movably mounted between the first rail and the third rail, and the second rail has a first side and a second side; wherein the first side of the second rail faces the first rail, and the second side of the second rail faces the third rail.

8. The slide rail assembly of claim 7, wherein the linear direction is substantially perpendicular to a longitudinal direction of the second rail.

9. The slide rail assembly of claim 7, wherein the second rail is arranged with at least one holding feature configured to temporarily hold the switch member in the first state.

10. The slide rail assembly of claim 9, wherein when the switch member is in the second state, a switch part of the switch member, the driving structure, and the front contact feature are located at a same horizontal position.

11. The slide rail assembly of claim 9, wherein one of the front contact feature of the third rail and the switch part of the switch member has a guiding surface.

12. The slide rail assembly of claim 5, wherein when the second rail is located at the first extended position relative to the first rail, the slide rail assembly has a first length; wherein when the second rail is located at the predetermined position relative to the first rail, the slide rail assembly has a second length smaller than the first length.

13. A slide rail assembly, comprising:
a first rail;
a second rail movable relative to the first rail;
a third rail movable relative to the second rail, the third rail being arranged with a driving structure and a front contact feature; and
a switch member linearly movable relative to the second rail along a linear direction to be in one of a first state and a second state;
wherein when the second rail is located at a first extended position relative to the first rail, the switch member is operable to switch from the first state to the second state;
wherein when the third rail is moved along a retracting direction, the driving structure of the third rail is configured to contact the switch member in the second state to allow the third rail to drive the second rail to move to a predetermined position along the retracting direction;
wherein when the third rail is moved a predetermined extended distance relative to the second rail at the predetermined position along an extending direction, the third rail is configured to drive the switch member to switch from the second state to the first state through the front contact feature;
wherein the slide rail assembly further comprises a rear base arranged on the first rail and an engaging mechanism arranged on the second rail; wherein when the second rail is located at the predetermined position, the engaging mechanism is blocked by the rear base, in order to prevent the second rail from being moved from the predetermined position along the extending direction.

14. The slide rail assembly of claim 13, wherein the rear base comprises a first base part, and the engaging mechanism comprises an engaging member; wherein when the second rail is located at the predetermined position, the engaging member is linearly moved to be blocked by the first base part of the rear base.

15. The slide rail assembly of claim 14, wherein the engaging mechanism further comprises an elastic member configured to provide an elastic force to the engaging member; wherein when the second rail is located at the predetermined position, the engaging member is blocked by the first base part of the rear base in response to the elastic force of the elastic member.

* * * * *